US012635269B2

(12) United States Patent
Hara et al.

(10) Patent No.: US 12,635,269 B2
(45) Date of Patent: May 19, 2026

(54) SEMICONDUCTOR DEVICE, EQUIPMENT, AND MANUFACTURING METHOD OF SEMICONDUCTOR DEVICE

(71) Applicant: CANON KABUSHIKI KAISHA, Tokyo (JP)

(72) Inventors: Takuya Hara, Kanagawa (JP); Takumi Ogino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 732 days.

(21) Appl. No.: 17/858,793

(22) Filed: Jul. 6, 2022

(65) Prior Publication Data

US 2023/0008401 A1 Jan. 12, 2023

(30) Foreign Application Priority Data

Jul. 9, 2021 (JP) ................................. 2021-114358
May 20, 2022 (JP) ................................. 2022-083066

(51) Int. Cl.
*H01L 23/00* (2006.01)
*H10F 39/00* (2025.01)

(52) U.S. Cl.
CPC ............. *H01L 24/08* (2013.01); *H01L 24/03* (2013.01); *H01L 24/05* (2013.01); *H01L 24/80* (2013.01); *H01L 24/94* (2013.01); *H01L 24/95* (2013.01); *H10F 39/018* (2025.01); *H10F 39/026* (2025.01); *H10F 39/809* (2025.01); *H10F 39/811* (2025.01); *H01L 2224/0362* (2013.01); *H01L 2224/03845* (2013.01); *H01L 2224/05553* (2013.01); *H01L 2224/05557* (2013.01); *H01L 2224/05647* (2013.01);
(Continued)

(58) Field of Classification Search
None
See application file for complete search history.

(56) References Cited

U.S. PATENT DOCUMENTS 5,753,536 A 5/1998 Sugiyama et al.
2017/0148765 A1* 5/2017 Yu ....................... H01L 25/0657
(Continued)

FOREIGN PATENT DOCUMENTS

JP 2015164190 A 9/2015

*Primary Examiner* — Julio J Maldonado
*Assistant Examiner* — Pinaki Das
(74) *Attorney, Agent, or Firm* — Canon U.S.A., Inc. IP Division

(57) ABSTRACT

A semiconductor device includes a first semiconductor component including a first semiconductor substrate and a first wiring structure, and a second semiconductor component including a second semiconductor substrate and a second wiring structure. A first surface of the first semiconductor component and a second surface of the second semiconductor component are bonded together. Assuming that regions having circumferences respectively corresponding to shapes obtained by vertically projecting the first surface, the second surface, the first wiring structure, and the second wiring structure on a virtual plane are first to fourth regions, respectively, an area of the first region is smaller than an area of the second region, the entire circumference of the first region is included in the second region, an area of the fourth region is smaller than an area of the third region, and the entire circumference of the fourth region is included in the third region.

18 Claims, 17 Drawing Sheets

(52) U.S. Cl.
CPC ............... *H01L 2224/05687* (2013.01); *H01L 2224/08145* (2013.01); *H01L 2224/80097* (2013.01); *H01L 2224/8083* (2013.01); *H01L 2224/80895* (2013.01); *H01L 2224/80896* (2013.01); *H01L 2224/80907* (2013.01); *H01L 2224/95136* (2013.01); *H01L 2924/3511* (2013.01)

(56) References Cited

U.S. PATENT DOCUMENTS

| | | | |
|---|---|---|---|
| 2018/0138164 A1* | 5/2018 | Lee | .................... H01L 21/76898 |
| 2020/0105600 A1* | 4/2020 | Lu | ............................ H01L 24/94 |
| 2020/0402945 A1 | 12/2020 | Zeng | |
| 2021/0134663 A1 | 5/2021 | Huang | |
| 2021/0134685 A1* | 5/2021 | Chen | ....................... H01L 24/05 |
| 2021/0175324 A1 | 6/2021 | Ogino et al. | |
| 2021/0375997 A1 | 12/2021 | Nakamura | |

* cited by examiner

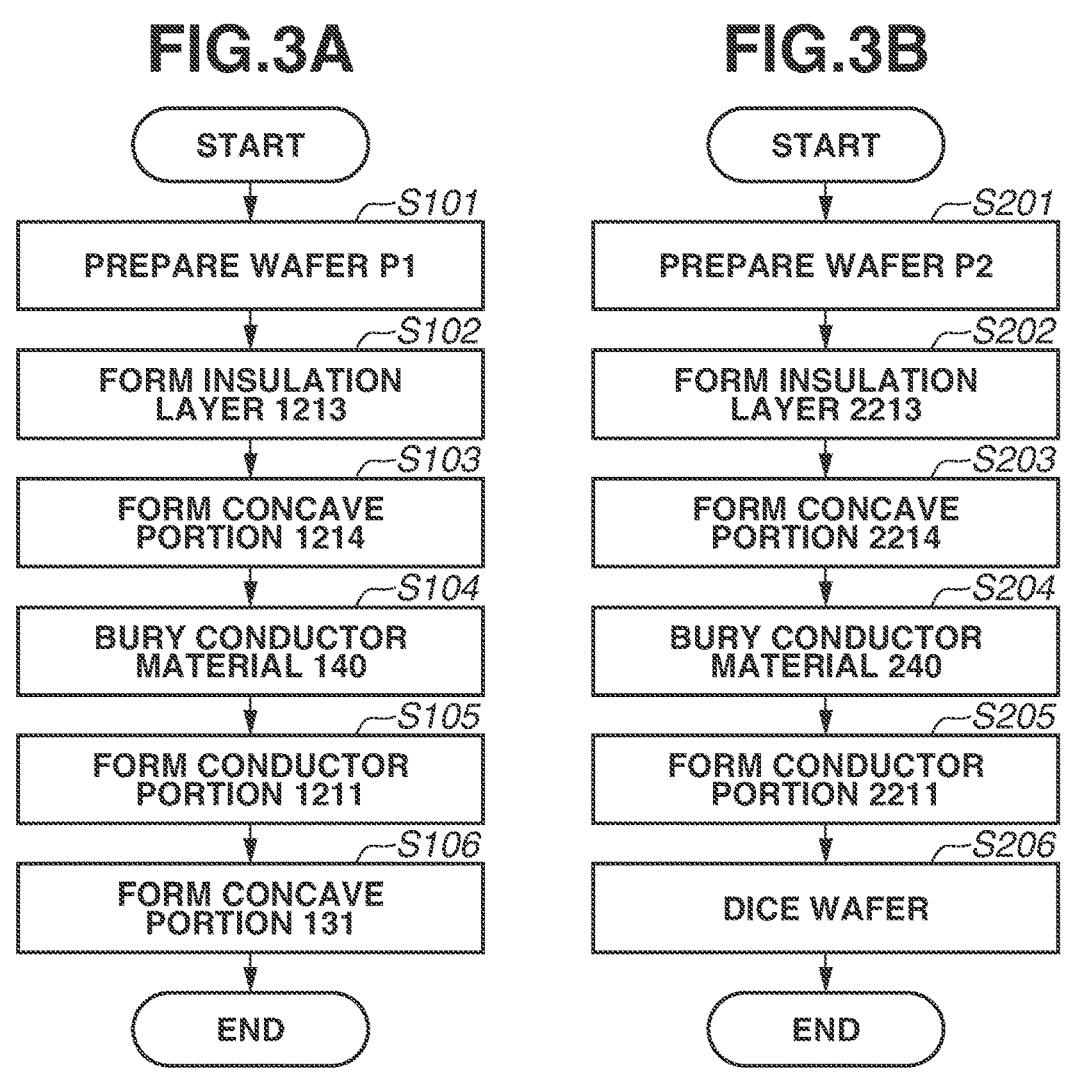
FIG.3A
START
S101 — PREPARE WAFER P1
S102 — FORM INSULATION LAYER 1213
S103 — FORM CONCAVE PORTION 1214
S104 — BURY CONDUCTOR MATERIAL 140
S105 — FORM CONDUCTOR PORTION 1211
S106 — FORM CONCAVE PORTION 131
END
FIG.3B
START
S201 — PREPARE WAFER P2
S202 — FORM INSULATION LAYER 2213
S203 — FORM CONCAVE PORTION 2214
S204 — BURY CONDUCTOR MATERIAL 240
S205 — FORM CONDUCTOR PORTION 2211
S206 — DICE WAFER
END
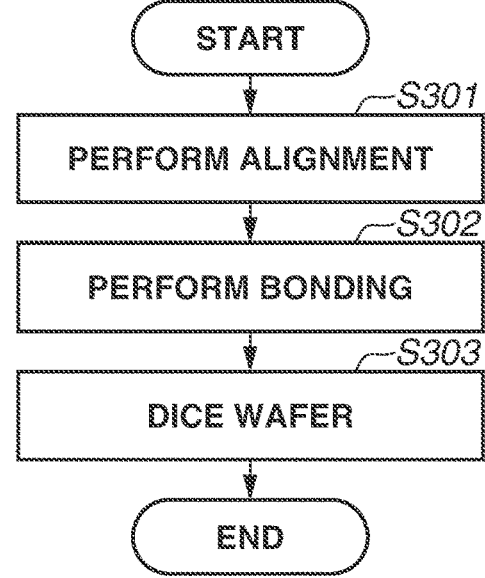
FIG.3C
START
S301 — PERFORM ALIGNMENT
S302 — PERFORM BONDING
S303 — DICE WAFER
END

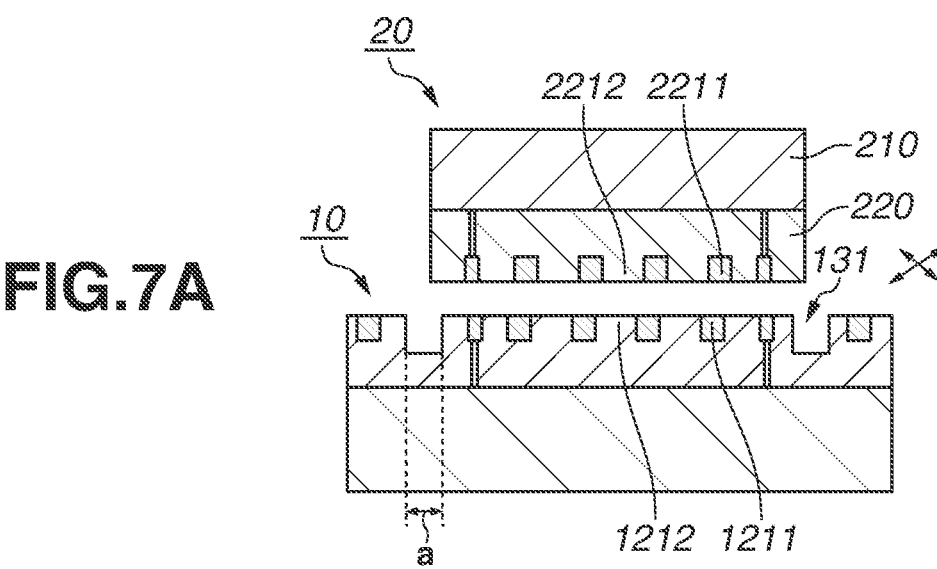
FIG.7A
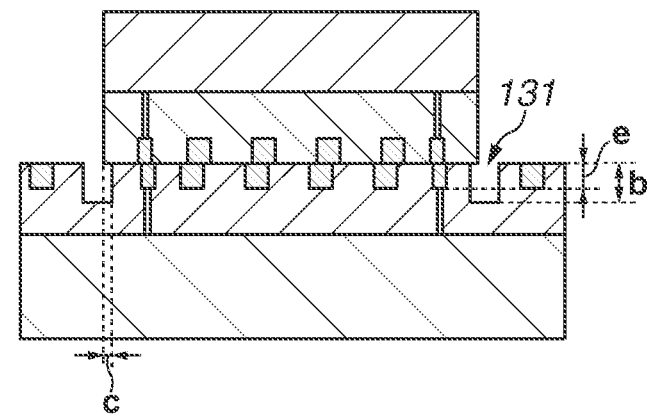
FIG.7B
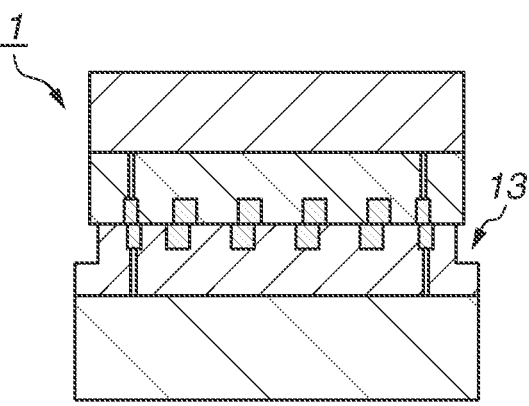
FIG.7C

FIG.8

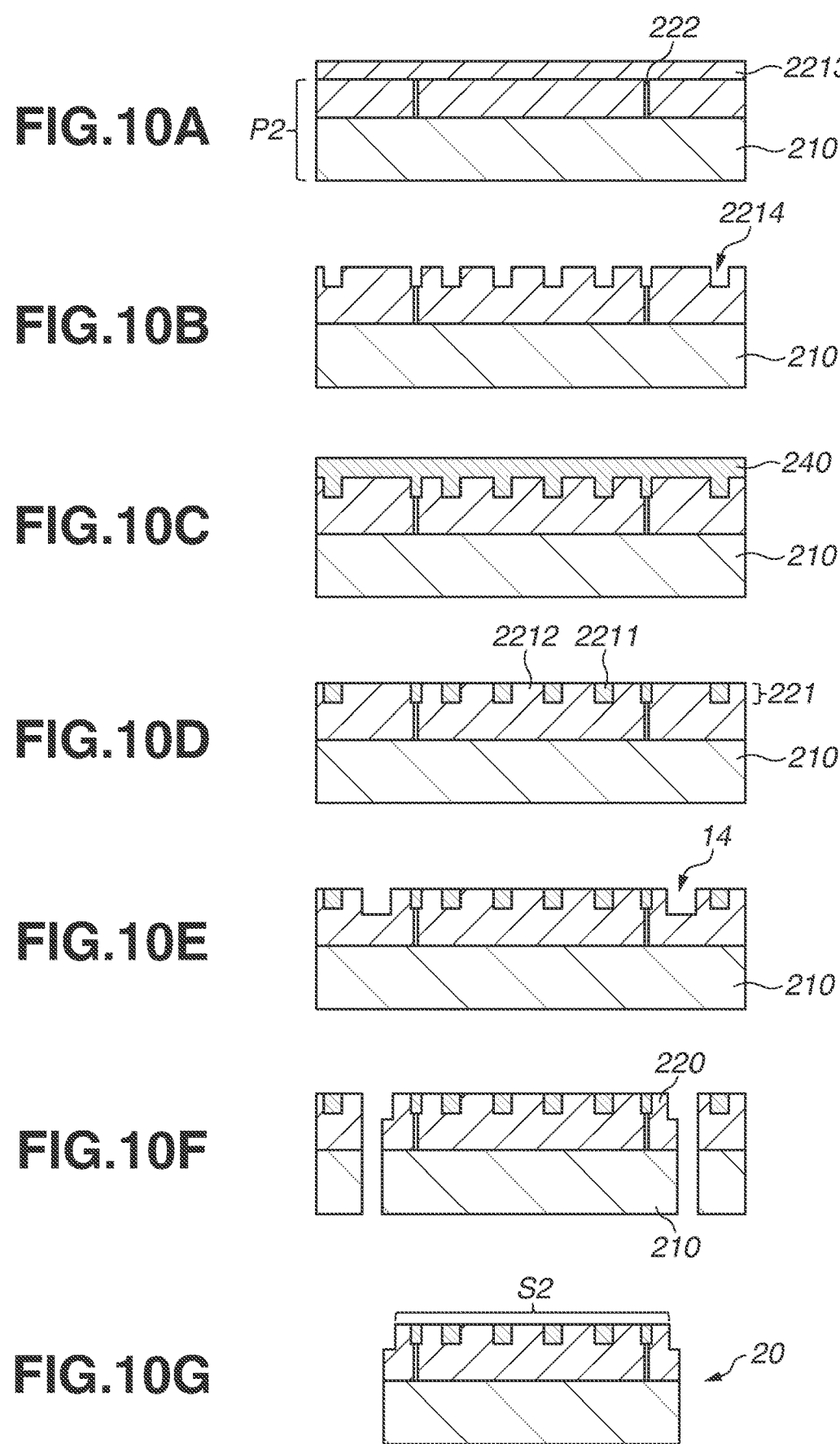

*2100*

IMAGE CAPTURING APPARATUS ~*2110*

IMAGE PROCESSING UNIT ~*2112*

PARALLAX ACQUISITION UNIT ~*2114*

DISTANCE ACQUISITION UNIT ~*2116*

COLLISION DETERMINATION UNIT ~*2118*

*2120*

VEHICLE INFORMATION ACQUISITION APPARATUS

*2125*~ CONTROL ECU

ALARM APPARATUS ~*2140*

*2150*

*2100*

*2120*

VEHICLE INFORMATION ACQUISITION APPARATUS

CONTROL ECU

ALARM APPARATUS

*2125*

*2140*

SEMICONDUCTOR DEVICE, EQUIPMENT, AND MANUFACTURING METHOD OF SEMICONDUCTOR DEVICE

BACKGROUND

Field of Art

The present disclosure relates to a semiconductor device, equipment, and a manufacturing method of a semiconductor device.

Description of the Related Art

A semiconductor device having a structure in which semiconductor components each including a semiconductor substrate and a wiring structure are stacked and the wiring structures are bonded together is known.

Japanese Patent Application Laid-Open No. 2015-164190 discusses a semiconductor device having a structure in which a conductor portion and an insulation film are located on an uppermost surface of each of wiring structures of two semiconductor components, and the conductor portions are bonded together and the insulation films are bonded together, thereby bonding the two semiconductor components.

In the case of bonding two semiconductor components by bonding the conductor portions and bonding the insulation films on a bonded surface, it is important for the bonded surface to have a high degree of flatness in terms of reliability of bonding. For example, if at least one of dies obtained by cutting a wafer is used as a semiconductor component, the flatness of the bonded surface may be impaired during cutting.

SUMMARY

In view of the above-described issue, the present disclosure is directed to improving the reliability of bonding in a semiconductor device obtained by bonding two semiconductor components on a bonded surface.

According to an aspect of the present invention, a semiconductor device includes a first semiconductor component including a first semiconductor substrate and a first wiring structure including at least one wiring layer and at least one insulation layer stacked on the first semiconductor substrate, the first semiconductor component having a first surface located on a side of the first wiring structure that is opposite to the first semiconductor substrate, and a second semiconductor component including a second semiconductor substrate and a second wiring structure including at least one wiring layer and at least one insulation layer stacked on the second semiconductor substrate, the second semiconductor component having a second surface located on a side of the second wiring structure that is opposite to the second semiconductor substrate, the first surface of the first semiconductor component and the second surface of the second semiconductor component being bonded together. In a case where a region having a circumference corresponding to a shape obtained by projecting the first surface on a virtual plane parallel to the first surface in a normal direction of the virtual plane is a first region, a region having a circumference corresponding to a shape obtained by projecting the second surface on the virtual plane in the normal direction of the virtual plane is a second region, a region having a circumference corresponding to a shape obtained by projecting the first wiring structure on the virtual plane in the normal direction of the virtual plane is a third region, and a region having a circumference corresponding to a shape obtained by projecting the second wiring structure on the virtual plane in the normal direction of the virtual plane is a fourth region, an area of the first region is smaller than an area of the second region, the entire circumference of the first region is included in the second region, an area of the fourth region is smaller than an area of the third region, and the entire circumference of the fourth region is included in the third region.

Further features of the present invention will become apparent from the following description of exemplary embodiments with reference to the attached drawings.

BRIEF DESCRIPTION OF THE DRAWINGS

FIGS. 3A to 3C are flowcharts each illustrating a manufacturing method of the semiconductor device according to the first exemplary embodiment.

FIGS. 7A to 7C each illustrate a manufacturing process of the semiconductor device according to the first exemplary embodiment.

FIG. 8 illustrates a manufacturing process of another example of the semiconductor device according to the first exemplary embodiment.

FIGS. 10A to 10G each illustrate a manufacturing process of the semiconductor device according to the second exemplary embodiment.

DESCRIPTION OF THE EMBODIMENTS

Figures 1A, 1B:
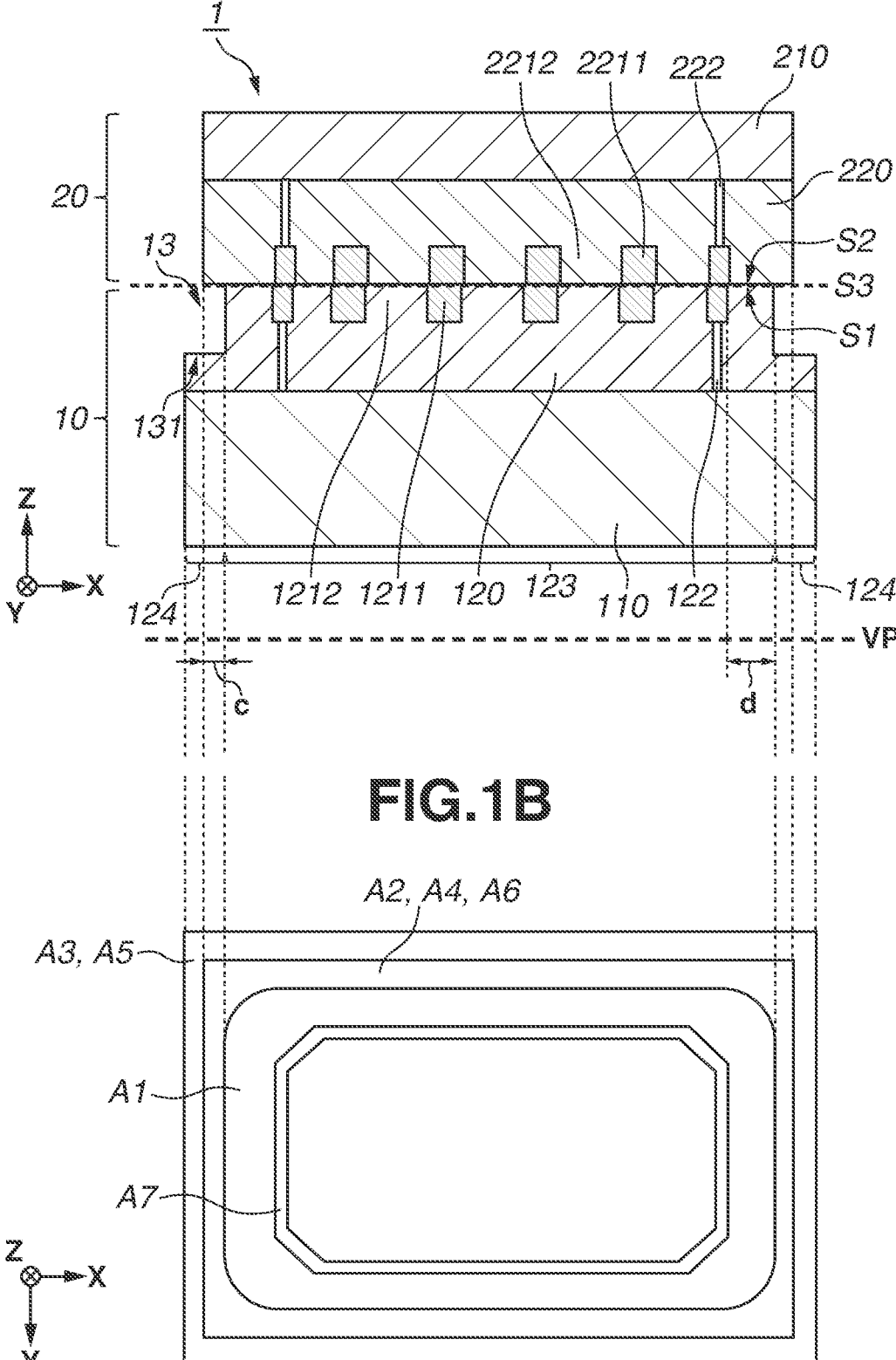
FIG. 1A is a sectional view illustrating an example of a semiconductor device according to a first exemplary embodiment.
FIG. 1B illustrates a projection of the semiconductor device according to the first exemplary embodiment.

Modes for carrying out the present invention will be described below with reference to the drawings. In the following description and the drawings, components common among a plurality of drawings are denoted by the same reference numerals. The common components will be described by cross-referring to the plurality of drawings, and descriptions of the components denoted by the same reference numerals will be omitted as appropriate. Components that have the same names and are denoted by different reference numerals may be distinguished by expressions "nth", for example, a first component, a second component, and a third component, as appropriate.

FIGS. 1A and 1B are diagrams for illustrating a semiconductor device 1. FIG. 1A is a sectional view illustrating the semiconductor device 1 according to a first exemplary embodiment. FIG. 1B illustrates a projection of the semiconductor device 1 obtained by vertically projecting each portion of the semiconductor device 1 on a virtual plane.

The semiconductor device 1 includes a first semiconductor component 10 (first circuit component) and a second semiconductor component 20 (second circuit component). The semiconductor device 1 has a structure in which the first semiconductor component 10 and the second semiconductor component 20 are stacked. In the following description, a direction in which the first semiconductor component 10 and the second semiconductor component 20 are stacked is defined as a stacking direction Z, and directions perpendicular to the stacking direction Z are defined as directions X and Y, respectively. The directions X and Y are directions perpendicular to each other. In the stacking direction Z, a direction from the first semiconductor component 10 to the second semiconductor component 20 in the semiconductor device 1 is defined as a positive direction.

The first semiconductor component 10 includes a first semiconductor substrate 110 and a first wiring structure 120.

The first wiring structure 120 has a structure in which at least one wiring layer and at least one insulation layer are stacked. The at least one wiring layer and the at least one insulation layer are alternately stacked and formed on the first semiconductor substrate 110. The first semiconductor component 10 has a first surface S1 located on a side of the first wiring structure 120 that is opposite to the first semiconductor substrate 110.

The first surface S1 is a surface of an insulation layer 121 that is opposite to the first semiconductor substrate 110. The insulation layer 121 is located farthest from the first semiconductor substrate 110 in the at least one insulation layer forming the first wiring structure 120. The first surface S1 is a flat surface. The insulation layer 121 includes a plurality of conductor portions 1211.

The insulation layer 121 has a damascene structure in which the conductor portions 1211 are respectively embedded in a plurality of concave portions formed in an insulator portion 1212 that forms the insulation layer 121. The conductor portions 1211 are each exposed to the first surface S1.

In other words, the first surface S1 is formed of the plurality of conductor portions 1211 and the insulator portion 1212 included in the insulation layer 121.

Each of the conductor portions 1211 may preferably contain metal. The conductor portions 1211 may preferably contain copper (Cu), but instead may contain, for example, gold (Au) or silver (Ag). In particular, the conductor portions 1211 may be preferably composed mainly of Cu. The insulator portion 1212 may be preferably composed mainly of a silicon compound. A barrier metal layer may be located on portions of the conductor portions 1211 that are adjacent to the insulator portion 1212. The barrier metal layer may contain tantalum or titanium. The first semiconductor substrate 110 includes a semiconductor element such as a transistor (not illustrated). This semiconductor element is electrically connected to the conductor portions 1211 through the wiring layer included in the first wiring structure 120. The material of the first semiconductor substrate 110 is not particularly limited. Silicon or compound semiconductor, such as III-V semiconductors or II-VI semiconductors, can be used. The first semiconductor substrate 110 may contain at least one of indium gallium arsenide (InGaAs), indium arsenic antimony (InAsSb), Indium arsenide (InAs), indium antimonide (InSb), and mercury cadmium telluride (HgCdTe).

The second semiconductor component 20 includes a second semiconductor substrate 210 and a second wiring structure 220.

The second wiring structure 220 has a structure in which at least one wiring layer and at least one insulation layer are stacked. The second wiring structure 220 is formed by the at least one wiring layer and the at least one insulation layer alternately being stacked on the second semiconductor substrate 210. The second semiconductor component 20 has a second surface S2 located on a side of the second wiring structure 220 that is opposite to the second semiconductor substrate 210.

The second surface S2 is a surface of an insulation layer 221 that is opposite to the second semiconductor substrate 210. The insulation layer 221 is located farthest from the second semiconductor substrate 210 in the at least one insulation layer forming the second wiring structure 220. The second surface S2 is a flat surface. The insulation layer 221 includes a plurality of conductor portions 2211.

The insulation layer 221 has a damascene structure in which the conductor portions 2211 are respectively embedded in a plurality of concave portions formed in an insulator portion 2212 that forms the insulation layer 221. The plurality of conductor portions 2211 are each exposed to the second surface S2. In other words, the second surface S2 is formed of the plurality of conductor portions 2211 and the insulator portion 2212 included in the insulation layer 221.

The conductor portions 2211 may preferably contain metal. The conductor portions 2211 may preferably contain Cu, but instead may contain Au or Ag. In particular, the conductor portions 2211 may be preferably composed mainly of Cu. The insulator portion 2212 may be preferably composed mainly of a silicon compound. A barrier metal layer may be located on portions of the conductor portions 2211 that are adjacent to the insulator portion 2212. The barrier metal layer may contain tantalum or titanium. The second semiconductor substrate 210 includes a semiconductor element such as a transistor (not illustrated). This semiconductor element is electrically connected to the conductor portions 2211 through the wiring layer included in the second wiring structure 220. The material of the second semiconductor substrate 210 is not particularly limited.

Silicon or compound semiconductor, such as III-V semiconductors or II-VI semiconductors, can be used. The second semiconductor substrate 210 may contain any one of InGaAs, InAsSb, InAs, InSb, and HgCdTe.

As illustrated in FIG. 1A, in the semiconductor device 1, the first semiconductor component 10 and the second semiconductor component 20 are bonded together on a bonded surface S3 in a state where the wiring structures (first wiring structure 120 and second wiring structure 220) included in the first semiconductor component 10 and the second semiconductor component 20, respectively, face each other and overlap each other. In other words, the first surface S1 of the first semiconductor component 10 and the second surface S2 of the second semiconductor component 20 are bonded together. On the bonded surface S3, a conductor portion 1211 included in the first wiring structure 120 and a conductor portion 2211 included in the second wiring structure 220 are bonded together. On the bonded surface S3, the insulator portion 1212 included in the first wiring structure 120 and the insulator portion 2212 included in the second wiring structure 220 are bonded together.

Next, the size and arrangement relationship of the first semiconductor component 10 and the second semiconductor component 20 that constitute the semiconductor device 1 according to the present exemplary embodiment will be described with reference to FIG. 1B. FIG. 1B illustrates a projection of the semiconductor device 1 obtained by vertically projecting each portion of the semiconductor device 1 on the virtual plane. Assuming that a plane parallel to the first surface S1 is defined as a virtual plane VP, consider a region obtained by vertically projecting each portion of the semiconductor device 1 on the virtual plane VP in a normal direction of the virtual plane VP. Assume that a region having a circumference corresponding to a shape obtained by vertically projecting the first surface S1 on the virtual plane VP is a first region A1 and a region having a circumference corresponding to a shape obtained by vertically projecting the second surface S2 on the virtual plane VP is a second region A2. In other words, the first region A1 is a region surrounded by the shape obtained by vertically projecting the first surface S1 on the virtual plane VP, and the second region A2 is a region surrounded by the shape obtained by vertically projecting the second surface S2 on the virtual plane VP. Also, assume that a region having a circumference corresponding to a shape obtained by vertically projecting the first wiring structure 120 on the virtual plane VP is a third region A3 and a region having a circumference corresponding to a shape obtained by vertically projecting the second wiring structure 220 on the virtual plane VP is a fourth region A4. In other words, the third region A3 is a region surrounded by the shape obtained by vertically projecting the first wiring structure 120 on the virtual plane VP, and the fourth region A4 is a region surrounded by the shape obtained by vertically projecting the second wiring structure 220 on the virtual plane VP.

As illustrated in FIG. 1B, in the semiconductor device 1, the first to fourth regions A1 to A4 satisfy the following relations (1) to (4).
(1) The area of the first region A1 is smaller than the area of the second region A2.
(2) The entire circumference of the first region A1 is included in the second region A2.
(3) The area of the fourth region A4 is smaller than the area of the third region A3.
(4) The entire circumference of the fourth region A4 is included in the third region A3.

As illustrated in FIG. 1B, in the semiconductor device 1, the area of the first region A1 is smaller than the area of the third region A3 and is smaller than the area of the fourth region A4. In the present exemplary embodiment, the semiconductor device 1 satisfies the relation that (area of first region A1)<(area of second region A2)=(area of fourth region A4)<(area of third region A3).

As described in detail below, in the present exemplary embodiment, the contour of the first surface S1 is formed by an etching process, and the contour of the second surface S2 is formed by a dicing process such as blade dicing. In general, during the dicing process such as blade dicing, damage can be added to a target to be processed, which can cause a phenomenon called chipping in which a chip end face is chipped off after cutting. If chipping occurs during cutting of the second semiconductor component 20, the flatness of the second surface S2 decreases in the vicinity of the contour of the second surface S2, which may result in generation of a step. Thus, in the present exemplary embodiment, a step is more likely to occur in the vicinity (peripheral portion) of the contour of the second surface S2 of the second semiconductor component 20 than in the vicinity of the contour of the first surface S1 of the first semiconductor component 10.

When the above-described relations (1) and (2) are satisfied, the circumference of the bonded surface S3 where the first semiconductor component 10 and the second semiconductor component 20 are bonded together is determined by the circumference of the first surface S1. In other words, the bonded surface S3 matches the first surface S1 and a portion of the second surface S2 that does not overlap the first surface S1 is not included in the bonded surface S3. Accordingly, when the above-described relations (1) and (2) are satisfied, at least a part of the area (peripheral portion) in the vicinity of the contour of the second surface S2 is not included in the bonded surface S3. This results in preventing a portion of the second surface S2 where the flatness is likely to decrease from being included in the bonded surface S3. This leads to an increase in bonding strength between the first semiconductor component 10 and the second semiconductor component 2, and also leads to an increase in the reliability of bonding.

As described below, in the present exemplary embodiment, the second semiconductor component 20 in the shape of a chip (die) is bonded to the wafer, and then the wafer is diced to cut the first semiconductor component 10 from the wafer, thereby manufacturing the semiconductor device 1. In this case, when the above-described relations (3) and (4) are satisfied, damage to the second semiconductor component 20 during the dicing process after bonding can be prevented. This leads to an increase in the bonding strength between the first semiconductor component 10 and the second semiconductor component 2, and also leads to an increase in the reliability of bonding.

Assume that a region having a circumference corresponding to a shape obtained by vertically projecting the first semiconductor substrate 110 on the virtual plane VP is a fifth region A5 and a region having a circumference corresponding to a shape obtained by vertically projecting the second semiconductor substrate 210 on the virtual plane VP is a sixth region A6. In other words, the fifth region A5 is a region surrounded by the shape obtained by vertically projecting the first semiconductor substrate 110 on the virtual plane VP, and the sixth region A6 is a region surrounded by the shape obtained by vertically projecting the second semiconductor substrate 210 on the virtual plane VP. As illustrated in FIG. 1B, in the semiconductor device 1, the fifth region A5 and the sixth region A6 may preferably satisfy the following relations (5) and (6).

(5) The area of the sixth region A6 is smaller than the area of the fifth region A5.

(6) The entire circumference of the sixth region A6 is included in the fifth region A5.

Further, in the semiconductor device 1, the first region A1 and the second region A2 may preferably satisfy the following relation (7).

(7) The circumference of the first region A1 does not overlap the circumference of the second region A2.

When the relation (7) is satisfied in addition to the relations (1) and (2), the circumference of the first region A1 does not overlap the circumference of the second region A2 as illustrated in FIG. 1B, and the circumference of the first region A1 is located at a distance from the circumference of the second region A2 on the inside of the circumference of the second region A2. Thus, the entire circumferential portion of the second surface S2 where the flatness is likely to decrease is not included in the bonded surface S3. Consequently, the bonding strength between the first semiconductor component 10 and the second semiconductor component 2 can be further increased and the reliability of bonding can be further increased.

When the above-described relation (5) is satisfied, assuming that a shortest distance between the circumference of the first region A1 and the circumference of the second region A2 is represented by "c", the distance "c" may preferably be more than or equal to 5 micrometers (μm). When the distance "c" is more than or equal to 5 μm, the portion of the second surface S2 where the flatness is likely to decrease can reliably be prevented from being included in the bonded surface S3, thereby further increasing the reliability of bonding. The upper limit of the distance "c" is not particularly limited, but may be less than or equal to 100 μm, may be less than or equal to 50 μm, or may be less than or equal to 20 μm.

As illustrated in FIG. 1A, in the present exemplary embodiment, the first semiconductor component 10 includes a concave portion 13 that is recessed toward the first semiconductor substrate 110 from the first surface S1. The concave portion 13 includes a bottom 131. The bottom 131 of the concave portion 13 may be a deepest portion from the first surface S1. In the present exemplary embodiment, the bottom 131 of the concave portion 13 is located inside the first wiring structure 120. However, the location of the bottom 131 of the concave portion 13 is not particularly limited. The bottom 131 of the concave portion 13 may be located inside the first semiconductor substrate 110.

In the length that is vertical to the first surface S1 on a section of the first semiconductor component 10 taken along a plane vertical to the first surface S1, the first semiconductor component 10 includes a first portion 123 with a first length and a second portion 124 with a second length longer than the first length. The first length and the second length correspond to the length in a Z-direction of the first portion 123 and the length in the Z-direction of the second portion 124, respectively, in FIG. 1A. In other words, the position of the bottom 131 described above corresponds to the position of the upper surface of the second portion 124.

The concave portion 13 may preferably surround the first surface S1 in a planar view of the first surface S1. In other words, the second portion 124 may preferably surround the first portion 123 in a planar view of the first surface S1. When the concave portion 13 is provided around the first surface S1 in a planar view, the above-described relations (1), (2), and (5) can be satisfied. Consequently, the reliability of bonding can be further increased as described above.

Assume herein that the depth of the concave portion 13, or the difference between the first length and the second length is represented by "b". The depth "b" of the concave portion 13 corresponds to the depth of the bottom 131 of the concave portion 13 based on a plane including the first surface S1. In other words, the depth "b" corresponds to the distance from the plane including the first surface S1 to the bottom 131 of the concave portion 13. Also, assume that the depth of the bottom of each conductor portion 1211 included in the first semiconductor component 10 is represented by "e". The depth "e" of the bottom of each conductor portion 1211 corresponds to the depth of the bottom of each conductor portion 1211 based on the plane including the first surface S1. In other words, the depth "e" corresponds to the distance from the plane including the first surface S1 to the bottom of each conductor portion 1211.

In this case, the depth "b" of the concave portion 13 may preferably be greater than the depth "e" of the bottom of each conductor portion 1211 (b>e). In other words, the bottom 131 of the concave portion 13 may preferably be located at a position further from the plane including the first surface S1 than the bottom of each conductor portion 1211. The depth "b" of the concave portion 13 may preferably be greater than the thickness of the wiring layer forming the first surface S1 in the at least one wiring layer forming the first wiring structure 120. As described below, in the case of bonding the first semiconductor component 10 and the second semiconductor component 20, a heat treatment is performed after the first surface S1 of the first semiconductor component 10 and the second surface S2 of the second semiconductor component 20 are bonded together, thereby increasing the bonding strength.

In the heat treatment, heat deformation can occur due to, for example, a difference in the coefficient of thermal expansion of materials forming the conductor portions 1211 and 2211 and the insulator portions 1212 and 2212. According to the present exemplary embodiment, the depth "b" of the concave portion 13 is set to be greater than the depth "e" of the bottom of each conductor portion 1211 and the thickness of the wiring layer forming the first surface S1, thereby making it possible to perform bonding while reducing effects due to heat deformation. This leads to an increase in the reliability of bonding.

The first semiconductor component 10 may include a sealing ring 122, and the second semiconductor component 20 may include a sealing ring 222. The sealing ring 122 is provided in the first wiring structure 120 and the sealing ring 222 is provided in the second wiring structure 220. The sealing ring 122 and the sealing ring 222 are each composed of conductive wires and via-holes formed over a plurality of wring layers and insulation layers. The provision of the sealing ring 122 and the sealing ring 222 prevents penetration of water from a chip end face of each of the first semiconductor component 10 and the second semiconductor component 20.

As illustrated in FIG. 1A, the distance from the sealing ring 122 to a side wall of the concave portion 13 is represented by "d". In this case, the distance "d" may preferably be more than or equal to 1 μm. Assuming that a region obtained by projecting the sealing ring 122 on the virtual plane VP in the normal direction of the virtual plane VP is a seventh region A7, the shortest distance "d" between the circumference of the seventh region A7 and the circumference of the first surface S1 may be preferably more than or equal to 1 μm. When the distance "d" is more than or equal to 1 μm, damage to the first semiconductor component 10 can be reduced during formation of the concave portion 13. When the distance "d" is more than or equal to 1 μm, penetration of water can be prevented even in a case where the concave portion 13 is formed.

It may be preferable that the contour of the first region A1 have no internal angle of less than or equal to 90°. In the present exemplary embodiment, the contour of the first region A1 has no angle and the long sides and short sides of the contour are smoothly connected with a curve as illustrated in FIG. 1B. As described below, the process of bonding the first semiconductor component 10 and the second semiconductor component 20 is completed by bonding the entire first surface S1 to the second surface S2. In this case, if the contour of the first region A1 has an internal angle of less than or equal to 10°, progress in bonding between the first surface S1 and the second surface S2 may be inhibited at the angle and the bonding may progress unevenly. This may cause a bonding failure and deterioration in the reliability of bonding. In contrast, according to the present exemplary embodiment, the contour of the first region A1 is set to have no internal angle of less than or equal to 90°, thereby preventing the bonding from progressing unevenly, which leads to an increase in the reliability of bonding.

Figure 2:
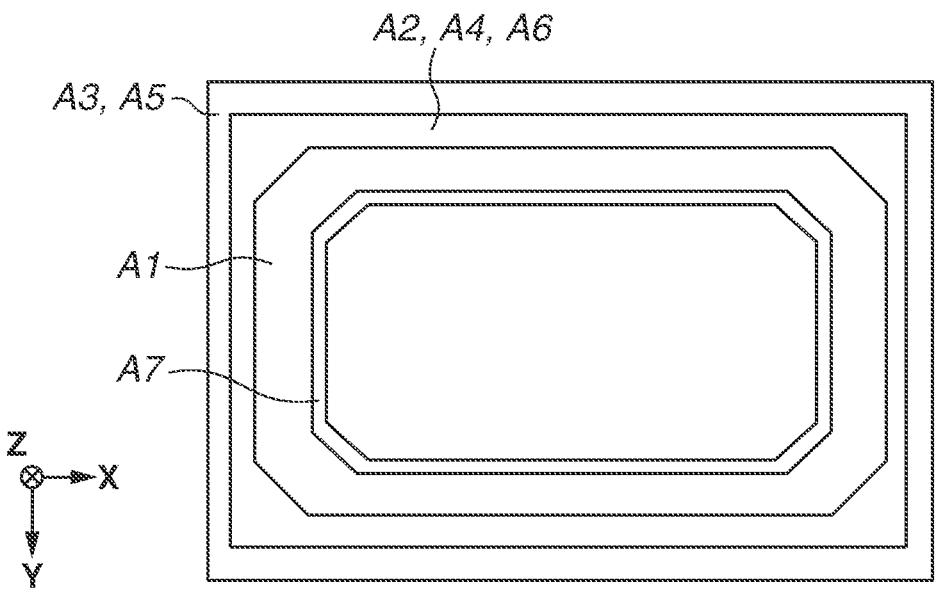
FIG. 2 illustrates a projection of another example of the semiconductor device according to the first exemplary embodiment.

While the present exemplary embodiment illustrates an example where the long sides and short sides of the contour of the first region A1 are smoothly connected with a curve having an arc shape, the present exemplary embodiment is not limited to this example. The long sides and short sides may be smoothly connected with curves having a shape other than an arc shape. The curvature of the curve is not particularly limited, as long as the first region A1 includes a curved portion. The contour of the first region A1 may have an internal angle of more than 90°. FIG. 2 illustrates a projection of a modified example of the semiconductor device 1 according to the present exemplary embodiment obtained by vertically projecting each portion of the semiconductor device 1 on the virtual plane VP in the same manner as in FIG. 1B. As illustrated in FIG. 2, the contour of the first region A1 may have a polygonal shape, and each internal angle of the contour of the first region A1 may be greater than 90°. Also, in this shape, the same advantageous effects can be obtained.

<<Manufacturing Method>>

Next, a manufacturing method of the semiconductor device 1 will be described. A manufacturing method of a wafer for the first semiconductor component 10 and a manufacturing method of the second semiconductor component 20 will be described first, and then a manufacturing method of the semiconductor device 1 using the wafer for the first semiconductor component 10 and the second semiconductor component 20 will be described. The wafer for the first semiconductor component 10 and the second semiconductor component 20 may be manufactured in an arbitrary order. For example, the wafer for the first semiconductor component 10 and the second semiconductor component 20 may be manufactured in this order, and the second semiconductor component 20 and the wafer for the first semiconductor component 10 may be manufactured in this order. Alternatively, these components may be simultaneously manufactured in parallel.

<Manufacturing Method of Wafer for First Semiconductor Component 10>

A manufacturing method of the wafer for the first semiconductor component 10 will now be described with reference to a flowchart illustrated in FIG. 3A and FIGS. 4A to 4E. FIG. 3A is a flowchart illustrating a manufacturing method of the wafer for the first semiconductor component 10. FIGS. 4A to 4E are schematic diagrams each illustrating a process in the manufacturing method of the wafer for the first semiconductor component 10. FIGS. 4A to 4E each illustrate a part of the wafer.

(Step S101)

A wafer P1 that is a part of a semiconductor wafer for the first semiconductor component 10 is prepared. The wafer P1 includes the first semiconductor substrate 110 and a semiconductor element (not illustrated) such as a transistor formed on the first semiconductor substrate 110. Although not illustrated, a gate electrode that forms the transistor, and insulation layers and wiring layers that cover the gate electrode are stacked and formed on the first semiconductor substrate 110. A wire included in each wiring layer is electrically connected to the gate electrode, source, and drain of the transistor via a contact plug. Each insulation layer includes a via plug that electrically connects wires included in upper and lower wiring layers. The guard ring 122 is also formed when the insulation layers and wiring layers are formed. The detailed description of the manufacturing method of the wafer P1 is omitted.

(Step S102)

Figures 4A, 4B, 4C, 4D, 4E:
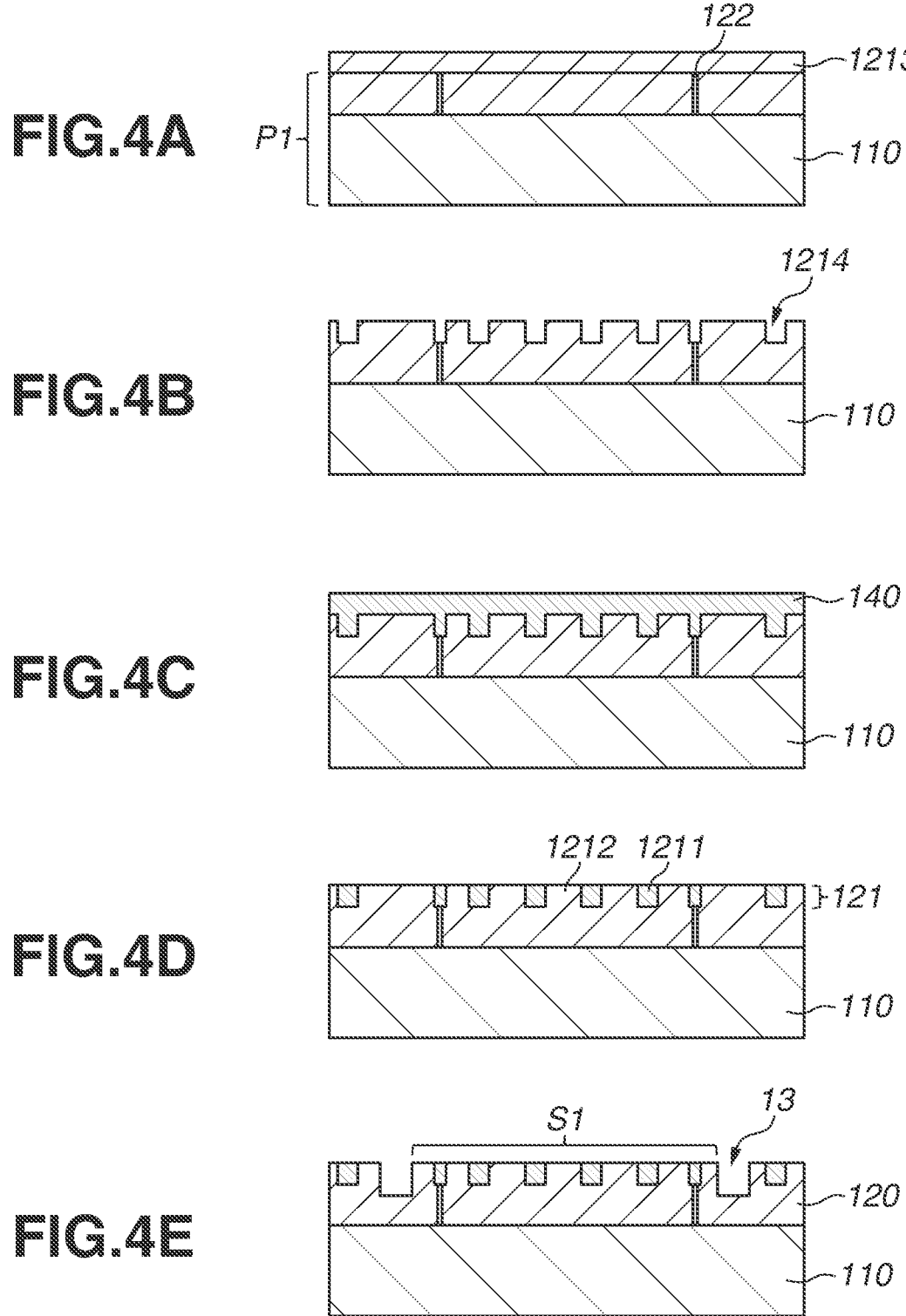
FIGS. 4A to 4E each illustrate a manufacturing process of the semiconductor device according to the first exemplary embodiment.

As illustrated in FIG. 4A, an insulation film 1213 is formed on the wafer P1. Examples of the insulation film 1213 include a silicon oxide film, a silicon nitride film, a silicon oxynitride film, a carbon-containing silicon oxide film, and a fluoride-containing silicon oxide film. The insulation film 1213 may be formed of a single layer made of one type of material, or may be formed of a plurality of layers made of different types of materials. In this case, for example, a silicon oxide film is formed and then planarization is performed by chemical mechanical polishing (CMP), thereby making it possible to reduce defects caused due to a step in the subsequent processes.

(Step S103)

Next, as illustrated in FIG. 4B, a plurality of concave portions 1214 in which a conductor material is to be buried is formed in the insulation layer 1213. At least some of the concave portions 1214 are formed to reach the uppermost wiring layer of the wafer P1. The concave portions 1214 are formed with an appropriate density on the entire chip area. The concave portions 1214 may be formed such that a bottom portion of at least some of the concave portions 1214 reaches the uppermost wiring layer of the wafer P1, or holes (via-holes) may be formed below the concave portions 1214. The order of forming the concave portions 1214 and the holes is not particularly limited.

(Step S104)

Next, a conductor material 140 is formed over the entire surface as illustrated in FIG. 4C.

In this case, the concave portions 1214 are buried with the conductor material 140. If holes are formed below the concave portions 1214, the holes are also buried with the conductor material 140. Copper can be used as the conductor material 140.

(Step S105)

Next, as illustrated in FIG. 4D, an extra amount of the conductor material 140 is removed by using a chemical mechanical polishing (CMP) method to form the conductor portions 1211. If holes are formed below the concave portions 1214, via-holes located below the conductor portions 1211 are formed in the portions corresponding to the holes. The formation of the conductor portions 1211 with an appropriate density over the entire chip area can prevent dishing or erosion from occurring due to the CMP process during the CMP process. This leads to an improvement in the flatness of the surface of the semiconductor wafer for the first semiconductor component 10 before bonding, and also leads to a reduction in defects caused due to a step during bonding. Through this process, the first wiring structure 120 is completed.

(Step S106)

Next, the concave portion 13 is formed by photolithography and etching as illustrated in FIG. 4E. On the upper surface of the wafer for the first semiconductor component 10, the region surrounded by the concave portion 13 corresponds to the first surface S1. Accordingly, the contour of the first surface S1 is formed by the etching process.

Figure 5:
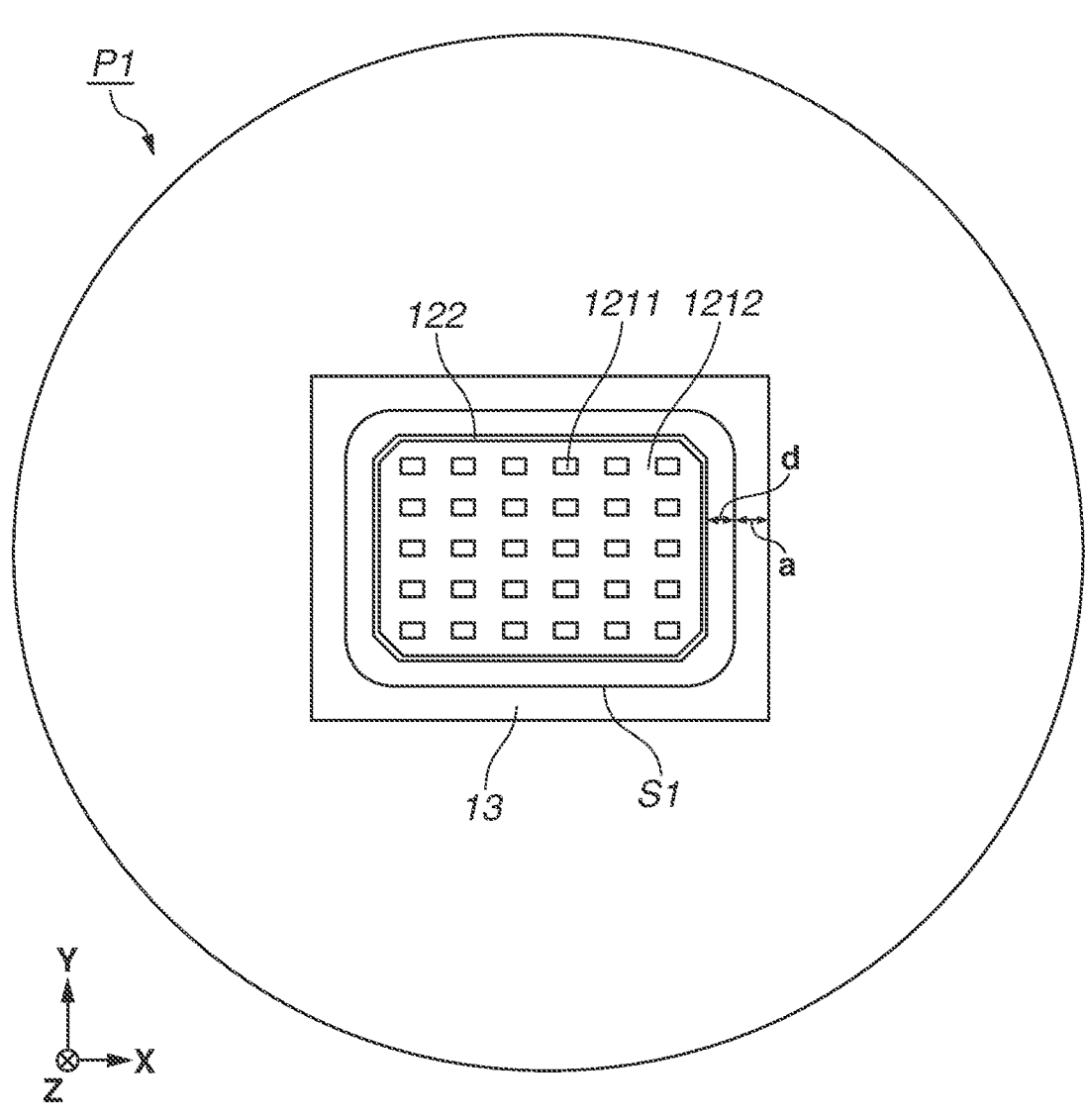
FIG. 5 is a top view of a wafer used for a first semiconductor component in the manufacturing process of the semiconductor device according to the first exemplary embodiment.

FIG. 5 is a top view of the wafer for the first semiconductor component 10 obtained after step S106. As described above, the first surface S1 is surrounded by the concave portion 13. Assuming that the width of the narrowest portion of the concave portion 13 is represented by "a", it may be preferable to satisfy a>c. The width "a" may be preferably more than or equal to 10 μm, and more preferably, more than or equal to 15 μm. When a>c is satisfied and the width "a" is more than or equal to 10 μm, the portion in the vicinity of the contour of the second surface S can be prevented from contacting the wafer for the first semiconductor component 10 during bonding even in a case where the above-described distance "c" is more than or equal to 5 μm. As described in detail below, a step can be generated in the vicinity of the contour of the second surface S2. This portion is prevented from contacting the wafer for the first semiconductor component 10, thereby achieving excellent contact properties of the portions of the first surface S1 and the second surface S2 that form the bonded surface S3 during bonding.

As illustrated in FIG. 5, in the present exemplary embodiment, the concave portion 13 is formed such that the first surface S1 has no internal angle of less than or equal to 90°. As a result, the bonding can progress evenly and smoothly in the process of bonding the second semiconductor component 20 and the wafer for the first semiconductor component 10 by bringing the second semiconductor component 20 and the wafer for the first semiconductor component 10 into contact with each other in step S302 to be described below. This leads to an increase in the reliability of bonding.

While FIG. 5 illustrates an example where only one portion corresponding to the first semiconductor component 10 is formed on the wafer P1, the present exemplary embodiment is not limited to this example. A plurality of portions corresponding to the first semiconductor component 10 may be formed on the wafer P1.

Through the above-described processes, the first semiconductor component 10 before bonding is completed.

<Manufacturing Method of Second Semiconductor Component 20>

A manufacturing method of the second semiconductor component 20 will now be described with reference to a flowchart illustrated in FIG. 3B and FIGS. 6A to 6F. FIG. 3B is a flowchart illustrating a manufacturing method of the second semiconductor component 20. FIGS. 6A to 6F are schematic diagrams each illustrating a process in the manufacturing method of the second semiconductor component 20. FIGS. 6A to 6F each illustrate a part of the wafer.

(Step S201)

A wafer P2 that is a part of a semiconductor wafer for the second semiconductor component 20 is prepared. The wafer P2 includes the second semiconductor substrate 210 and a semiconductor element (not illustrated) such as a transistor formed on the second semiconductor substrate 210. Although not illustrated, a gate electrode that forms the transistor, and insulation layers and wiring layers that cover the gate electrode are stacked and formed on the second semiconductor substrate 210. A wire included in each wiring layer is electrically connected to the gate electrode, source, and drain of the transistor via a contact plug. Each insulation layer includes a via plug that electrically connects wires included in upper and lower wiring layers. The guard ring 222 is also formed when the insulation layers and wiring layers are formed. The detailed description of the manufacturing method of the wafer P2 is omitted.

(Step S202)

Figures 6A, 6B, 6C, 6D, 6E, 6F:
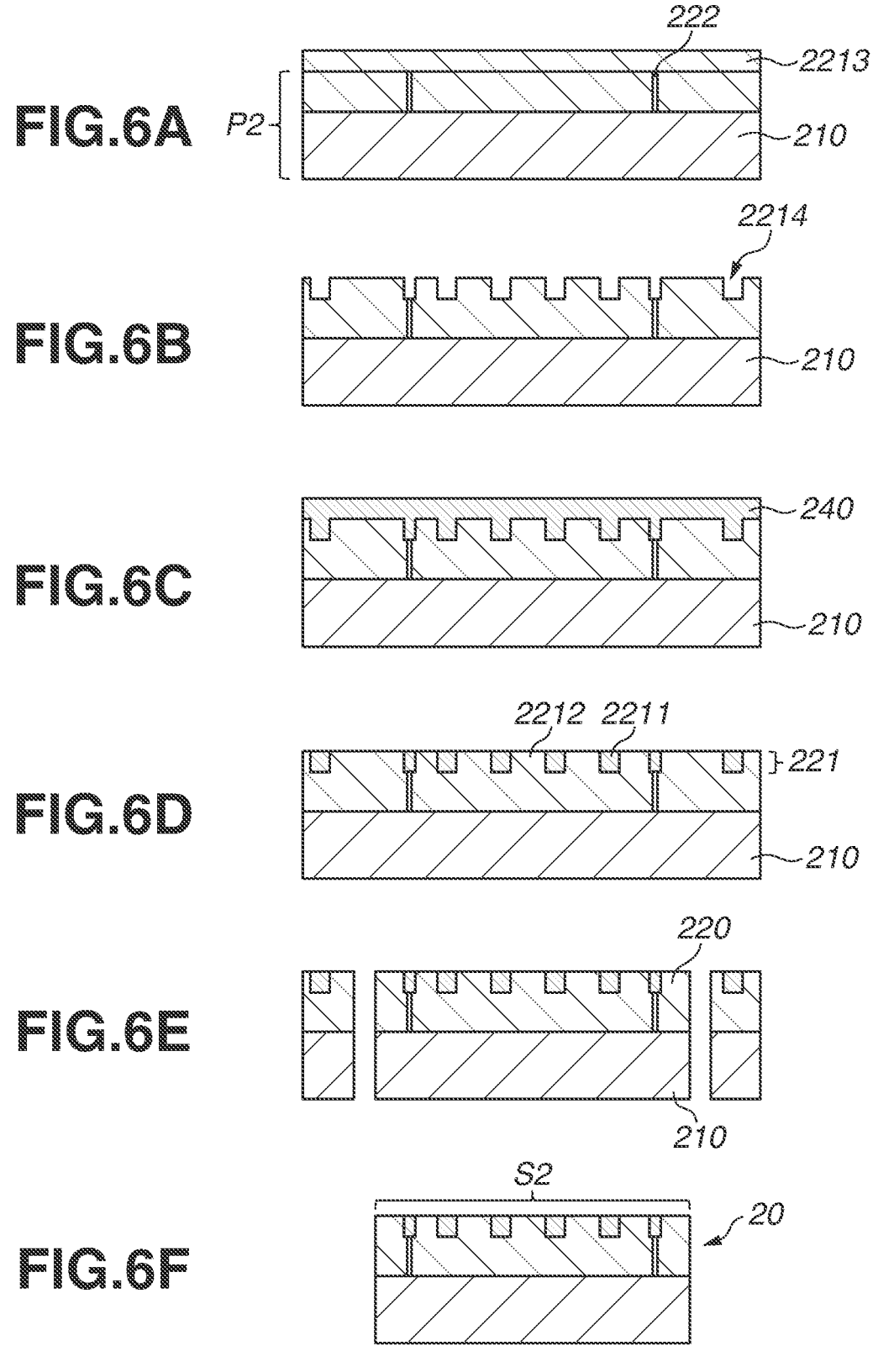
FIGS. 6A to 6F each illustrate a manufacturing process of the semiconductor device according to the first exemplary embodiment.

As illustrated in FIG. 6A, an insulation film 2213 is formed on the wafer P2. Examples of the insulation film 2213 include a silicon oxide film, a silicon nitride film, a silicon oxynitride film, a carbon-containing silicon oxide film, and a fluoride-containing silicon oxide film. The insulation film 2213 may be formed of a single layer made of one type of material, or may be formed of a plurality of layers made of different types of materials. In this case, for example, a silicon oxide film is formed and then planarization is performed by CMP, thereby making it possible to reduce defects caused due to a step in the subsequent processes.

(Step S203)

Next, a plurality of concave portions 2214 in which a conductor material is to be buried is formed in the insulation layer 2213 as illustrated in FIG. 6B. The concave portions 2214 may be formed such that a bottom portion of at least some of the concave portions 2214 reaches the uppermost wiring layer of the wafer P2. The concave portions 2214 are formed with an appropriate density over the entire chip area. The plurality of concave portions 2214 may be formed such that the bottom portion of at least some of the concave portions 2214 reaches the uppermost wiring layer of the wafer P2, or holes (via-holes) may be formed below the concave portions 2214. The order of forming the plurality of concave portions 2214 and the holds is not particularly limited.

(Step S204)

Next, a conductor material 240 is formed over the entire surface as illustrated in FIG. 6C.

In this case, the concave portions 2214 are buried with the conductor material 240. If holes are formed below the concave portions 2214, the holes are also buried with the conductor material 240. Copper can be used as the conductor material 240.

(Step S205)

Next, an extra amount of the conductor material 240 is removed by the CMP method to form the conductor portions 2211 as illustrated in FIG. 6D. If holes are formed below the concave portions 2214, via-holes located below the conductor portions 2211 are formed in the portions corresponding to the holes. The formation of the conductor portions 1211 with an appropriate density over the entire chip area can prevent dishing or erosion from occurring due to the CMP process during the CMP process. This leads to an improvement in the flatness of the surface of the semiconductor wafer for the second semiconductor component 20 before bonding, and also leads to a reduction in defects caused due to a step during bonding. Through this process, the second wiring structure 220 is completed.

(Step S206)

Next, as illustrated in FIG. 6E, the wafer planarized by the CMP method in step S205 is diced to form the second semiconductor component 20. As a dicing method, a dicing process such as blade dicing using a blade, or laser dicing using a laser is used. Two or more types of these methods may be used in combination.

Through the above-described processes, the second semiconductor component 20 before bonding illustrated in FIG. 6F is completed.

The contour of the second surface S2 serving as the bonded surface of the second semiconductor component 20 is formed by dicing in step S206. If chipping occurs in the dicing process, the flatness of the second surface S2 decreases in the vicinity of the contour of the second surface S2, which may result in generation of a step. Accordingly, the second semiconductor component 20 may include a step in the normal direction of the second surface S2 in the vicinity of the contour of the second surface S2.

Through the above-described processes, the second semiconductor component 20 before bonding is completed.
<Manufacturing Method of Semiconductor Device 1>

Lastly, a manufacturing method of the semiconductor device 1 will be described with reference to a flowchart illustrated in FIG. 3C and FIGS. 7A to 7C. FIG. 3C is a flowchart illustrating a manufacturing method of the semiconductor device 1. FIGS. 7A to 7C are schematic diagrams each illustrating a process in the manufacturing method of the semiconductor device 1. FIGS. 7A to 7C each illustrate a part of the wafer.
(Step S301)

As illustrated in FIG. 7A, the second semiconductor component 20 is reversed to face the wafer to be used for the first semiconductor component 10. More specifically, the second semiconductor component 20 and the wafer for the first semiconductor component 10 are opposed to each other so that the second surface S2 of the second semiconductor component 20 and the first surface S1 of the first semiconductor component 10 face each other.

An alignment process is performed such that the conductor portions 1211 of the first semiconductor component 10 and the conductor portions 2211 of the second semiconductor component 20 overlap each other in a planar view and the insulator portion 1212 of the first semiconductor component 10 and the insulator portion 2212 of the second semiconductor component 20 overlap each other in a planar view. The alignment process may be performed by rotating the first semiconductor component 10 in an XY direction within an XY plane, or may be performed by rotating the second semiconductor component 20 in the XY direction within the XY plane, or may be performed using these methods in combination.

According to the present exemplary embodiment, in this process, the second semiconductor component 20 and the wafer for the first semiconductor component 10 are aligned such that the first region A1 obtained by vertically projecting the first surface S1 on the virtual plane VP is included in the second region A2 obtained by vertically projecting the second surface S2 on the virtual plane VP. This prevents the contour of the second surface S2 of the second semiconductor component 20 from contacting the first surface S1 of the first semiconductor component 10 even when the second semiconductor component 20 and the wafer for the first semiconductor component 10 are bonded together in the subsequent processes. As described above, the second semiconductor component 20 can include a step in the vicinity of the contour of the second surface S2. However, according to the present exemplary embodiment, the portion where the flatness of the second surface S2 is likely to decrease can be prevented from being included in the bonded surface S3. This leads to an increase in the bonding strength between the first semiconductor component 10 and the second semiconductor component 2 can be increased, and also leads to an increase in the reliability of bonding.

Further, the contour of the second surface S2 of the second semiconductor component 20 may preferably fully overlap the concave portion 13 of the wafer for the first semiconductor component 10 in a state where the alignment is completed in this process. In other words, the entire region (shape) obtained by vertically projecting the contour of the second surface S2 on the virtual plane VP may be preferably included in the region obtained by vertically projecting the concave portion 13 on the virtual plane VP. This enables the contour of the second surface S2 to face the concave portion 13 even when the second semiconductor component 20 and the wafer to be used for the first semiconductor component 10 are bonded together in the subsequent process. Accordingly, the contour of the second surface S2 of the second semiconductor component 20 and the wafer for the first semiconductor component 10 can be prevented from contacting each other during bonding. This leads to an increase in the bonding strength between the first semiconductor component 10 and the second semiconductor component 2 can be increased, and also leads to an increase in the reliability of bonding.

The above-described distance "c" corresponds to the width of the narrowest portion of the region where the second surface S2 of the second semiconductor component 20 and the concave portion 13 overlap each other in a planar view (see FIG. 7B). As described above, when the distance "c" is more than or equal to 5 μm, the portion of the second surface S2 where the flatness is likely to decrease can be more reliably prevented from being included in the bonded surface S3, thereby further increasing the reliability of bonding.
(Step S302)

Next, the second semiconductor component 20 and the wafer for the first semiconductor component 10 are bonded together on the bonded surface S3 as illustrated in FIG. 7B. After bonding, the structure is obtained in which the second semiconductor component 20 is stacked on the wafer for the first semiconductor component 10. Bonding may be performed by, for example, performing a temporary bonding process and then performing a main bonding process. First, the insulator portion 1212 of the first surface S1 and the insulator portion 2212 of the second surface S2 are activated by plasma activation and then the activated insulator portions 1212 and 2212 are bonded together, thereby performing the temporary bonding process for bonding the second semiconductor component 20 and the wafer for the first semiconductor component 10. Thereafter, for example, a heat treatment is performed at 350° C. to thereby bond the insulator portion 1212 and the insulator portion 2212 on the bonded surface S3 more tightly (main bonding process) than in the temporary bonding process. The conductor portions 1211 and the conductor portions 2211 are bonded together by interdiffusion of copper between the conductor portions 1211 and the conductor portions 2211.

The heat treatment may cause heat deformation due to the difference in the coefficient of thermal expansion between the conductor portions 1211 and 2211 and the insulator portions 1212 and 2212. If heat deformation occurs, the flatness of each of the first surface S1 and the second surface S2 decreases, which leads to a decrease in bonding strength. Accordingly, in the present exemplary embodiment, the depth "b" of the concave portion 13 is set to be greater than the depth "e" of the bottom of each conductor portion 1211 and the thickness of the wiring layer forming the first surface S1. Consequently, bonding can be performed while reducing effects due to heat deformation that can be caused during the heat treatment. This leads to an increase in the reliability of bonding.

After bonding, a process for processing the second semiconductor component 20 stacked on the wafer used for the first semiconductor component 10 may be provided. For example, a process for reducing the thickness of the second semiconductor substrate 210 of the second semiconductor component 20 may be provided. As a method for reducing the thickness of the second semiconductor substrate 210, backgrinding, CMP, etching, or the like can be used. Alternatively, a film formation process for forming a film, such as a metal oxide film, an antireflection film, or an insulation film, may be provided.

Figure 8:
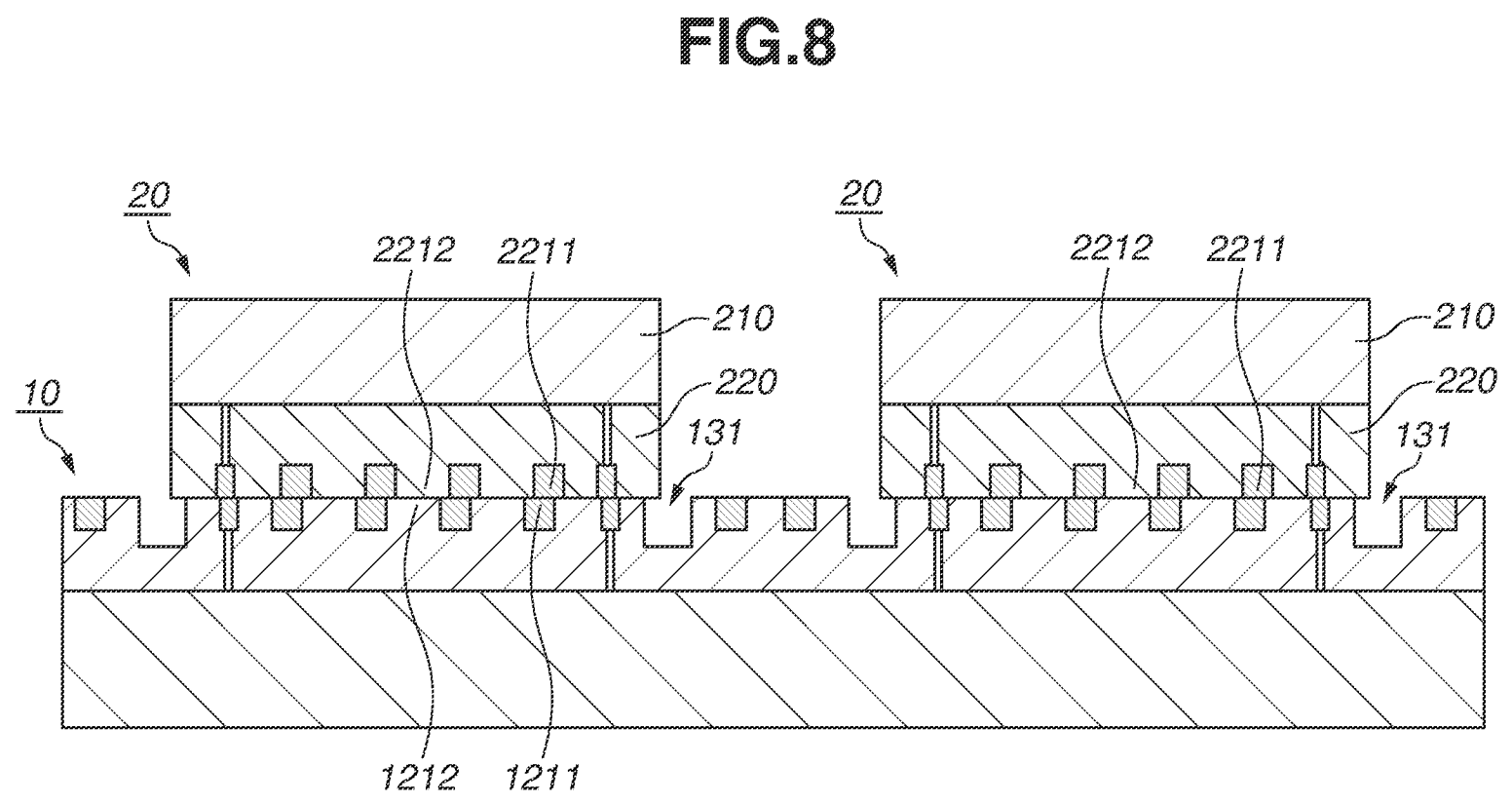

Steps S301 and S302 may be repeatedly performed to stack a plurality of second semiconductor components 20 on a single wafer for the first semiconductor component 10 as illustrated in FIG. 8. In this case, the temporary bonding process is performed on each of the plurality of second semiconductor components 20, and the main bonding process may be collectively performed on the plurality of second semiconductor components 20. Examples of the configuration in which the plurality of second semiconductor components 20 is stacked on a single wafer for the first semiconductor component 10 include a configuration in which the plurality of second semiconductor components 20 is stacked on different regions, respectively, on the wafer for the first semiconductor component 10. Alternatively, one second semiconductor component 20 may be stacked on another second semiconductor component 20 that is already stacked on the wafer for the first semiconductor component 10. According to this configuration, a semiconductor component formed by stacking three or more components (semiconductor components) can be obtained.
(Step S303)

Next, the wafer for the first semiconductor component 10 is diced to obtain the semiconductor device 1 as illustrated in FIG. 7C. Thus, the semiconductor device 1 is completed.

The present exemplary embodiment described above illustrates a configuration example where the first semiconductor component 10 in the shape of a wafer is bonded to the second semiconductor component 20 that is diced and in the shape of a chip (also called a die). This bonding method is also called die-to-wafer bonding. However, the bonding method is not limited to this example. The first semiconductor component 10 that is diced and in the shape of a chip may also be bonded to the second semiconductor component 20 that is in the shape of a chip. Also, in this case, the first semiconductor component 10 is provided with the concave portion 13, which leads to an increase in the bonding strength between the first semiconductor component 10 and the second semiconductor component 20, and also leads to an increase in the reliability of bonding.

Figures 9A, 9B:
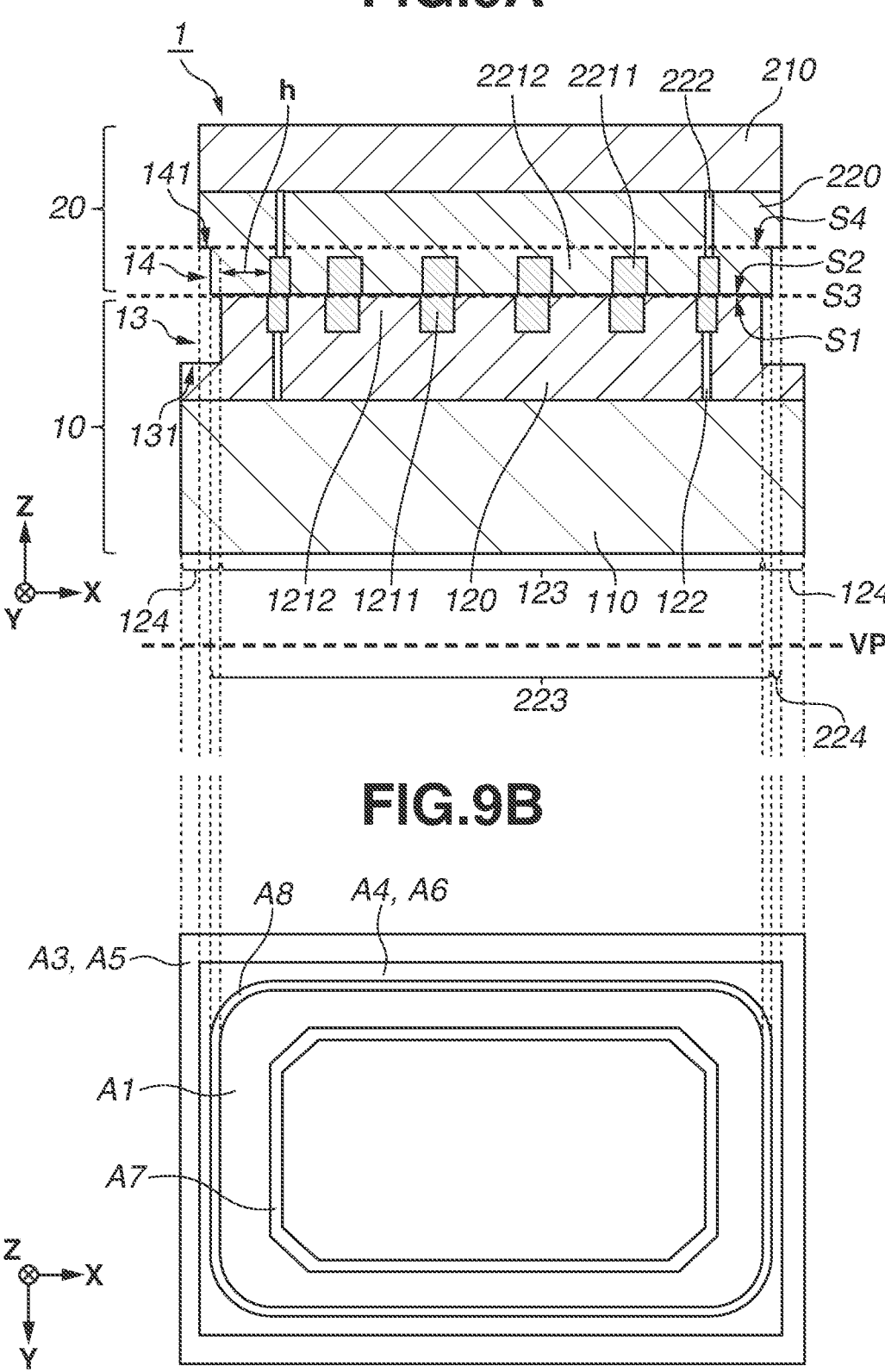
FIG. 9A is a sectional view illustrating an example of a semiconductor device according to a second exemplary embodiment.
FIG. 9B illustrates a projection of the semiconductor device according to the second exemplary embodiment.

FIGS. 9A and 9B each illustrate the semiconductor device 1 according to a second exemplary embodiment. FIG. 9A is a sectional view of the semiconductor device 1. FIG. 9B illustrates a projection of the semiconductor device 1 obtained by vertically projecting each portion of the semiconductor device 1 on a virtual plane VP. In the present exemplary embodiment, components similar to those in a sectional structure of the semiconductor device 1 illustrated in FIGS. 1A and 1B are denoted by the same reference numerals, and repeated descriptions are omitted.

As illustrated in FIG. 9A, in the present exemplary embodiment, the second semiconductor component 20 includes a concave portion 14 that is recessed toward the second semiconductor substrate 210 from the second surface S2. The concave portion 14 includes a bottom 141. The bottom 141 of the concave portion 14 may be a deepest portion from the second surface S2. The second semiconductor component 20 includes a fourth surface S4 located on a side of the concave portion 14 that is opposite to the second surface S2.

The size and layout relationship of the first semiconductor component 10 and the second semiconductor component 20 that constitute the semiconductor device 1 according to the present exemplary embodiment will be described with reference to FIG. 9B. FIG. 9B illustrates a projection of the semiconductor device 1 obtained by vertically projecting each portion of the semiconductor device 1 on the virtual plane. Assuming that a plane parallel to the first surface S1 is defined as the virtual plane VP, consider a region obtained by vertically projecting each portion of the semiconductor device 1 on the virtual plane VP in the normal direction of the virtual plane VP. Assume that a region having a circumference corresponding to a shape obtained by vertically projecting the first surface S1 on the virtual plane VP is the first region A1, and a region having a circumference corresponding to a shape obtained by vertically projecting the second surface S2 on the virtual plane VP is an eighth region A8. In other words, the first region A1 is a region surrounded by the shape obtained by vertically projecting the first surface S1 on the virtual plane VP, and the eighth region A8 is a region surrounded by the shape obtained by vertically projecting the second surface S2 on the virtual plane VP. Also, assume that a region having a circumference corresponding to a shape obtained by vertically projecting the first wiring structure 120 on the virtual plane VP is the third region A3, and a region having a circumference corresponding to a shape obtained by vertically projecting the second wiring structure 220 on the virtual plane VP is the fourth region A4. In other words, the third region A3 is a region surrounded by the shape obtained by vertically projecting the first wiring structure 120 on the virtual plane VP, and the fourth region A4 is a region surrounded by the shape obtained by vertically projecting the second wiring structure 220 on the virtual plane VP.

As illustrated in FIG. 9B, in the semiconductor device 1, the regions (first region A1, third region A3, fourth region A4, and eighth region A8) satisfy the following relations (1) to (6).
(1) The area of the first region A1 is smaller than the area of the eighth region A8.
(2) The entire circumference of the first region A1 is included in the eighth region A8.
(3) The area of the seventh region A7 is smaller than the area of the fourth region A4.
(4) The entire circumference of the seventh region A7 is included in the fourth region A4.
(5) The area of the fourth region A4 is smaller than the area of the third region A3.
(6) The entire circumference of the fourth region A4 is included in the third region A3. As illustrated in FIG. 9B, in the semiconductor device 1, the area of the first region A1 is smaller than the area of the third region A3 and is smaller than the area of the fourth region A4. In the present exemplary embodiment, the semiconductor device 1 satisfies the relation that (area of first region A1)<(area of eighth region A8)<(area of fourth region A4)<(area of third region A3).

As described in detail below, in the present exemplary embodiment, the contour of the first surface S1 is formed by the etching process, the contour of the second surface S2 is formed by the etching process, and the contour of the fourth surface S4 is formed by the dicing process such as blade dicing. In general, during the dicing process such as blade dicing, damage can be added to an object to be processed, which can cause a phenomenon called chipping in which a chip end face is chipped off after cutting. If chipping occurs during cutting of the second semiconductor component 20, the flatness of the fourth surface S4 decreases in the vicinity of the contour of the fourth surface S4, which may result in generation of a step. Thus, in the present exemplary embodiment, a step is more likely to occur in the vicinity (peripheral portion) of the contour of the fourth surface S4 of the second semiconductor component 20 than in the vicinity of the contour of the first surface S1 of the first semiconductor component 10.

When the above-described relations (3) and (4) are satisfied, at least a part of the area in the vicinity (peripheral portion) of the contour of the fourth surface S4 is not included in the second surface S2. As a result, the portion of the second surface S2 where the flatness is likely to decrease can be prevented from being included in the bonded surface S3. This leads to an increase in the bonding strength between the first semiconductor component 10 and the second semiconductor component 2, and also leads to an increase in the reliability of bonding.

As described below, in the present exemplary embodiment, the second semiconductor component 20 in the shape of a chip (die) is bonded to the wafer, and then the wafer is diced to cut the first semiconductor component 10 from the wafer, thereby manufacturing the semiconductor device 1. In this case, when the above-described relations (5) and (6) are satisfied, damage to the second semiconductor component 20 during the dicing process after bonding can be prevented. This leads to an increase in the bonding strength between the first semiconductor component 10 and the second semiconductor component 2, and also leads to an increase in the reliability of bonding.

Assume that a region having a circumference corresponding to a shape obtained by vertically projecting the first semiconductor substrate 110 on the virtual plane VP is the fifth region A5, and a region having a circumference corresponding to a shape obtained by vertically projecting the second semiconductor substrate 210 on the virtual plane VP is the sixth region A6. In other words, the fifth region A5 is a region surrounded by the shape obtained by vertically projecting the first semiconductor substrate 110 on the virtual plane VP, and the sixth region A6 is a region surrounded by the shape obtained by vertically projecting the second semiconductor substrate 210 on the virtual plane VP. As illustrated in FIG. 9B, in the semiconductor device 1, the fifth region A5 and the sixth region A6 may preferably satisfy the following relations (7) and (8).
(7) The area of the sixth region A6 is smaller than the area of the fifth region A5.
(8) The entire circumference of the sixth region A6 is included in the fifth region A5. Additionally, in the semiconductor device 1, the first region A1 and the eighth region A8 may preferably satisfy the following relation (9).
(9) The circumference of the first region A1 and the circumference of the eighth region A8 do not overlap each other. When the relation (9) is satisfied in addition to the relations (7) and (8), the circumference of the first region A1 and the circumference of the eighth region A8 do not overlap each other and the circumference of the first region A1 is located at a distance from the circumference of the eighth region A8 on the inside of the circumference of the eighth region A8 as illustrated in FIG. 9B. Thus, the entire circumferential portion of the second surface S2 is not included in the bonded surface S3.

As illustrated in FIG. 9A, in the present exemplary embodiment, the second semiconductor component 20 includes the concave portion 14 that is recessed toward the second semiconductor substrate 210 from the second surface S2. In the present exemplary embodiment, the bottom 141 of the concave portion 14 is located inside the second wiring structure 220. However, the location of the bottom 141 of the concave portion 14 is not limited to this example. The bottom 141 of the concave portion 14 may be located inside the second semiconductor substrate 210.

In the length that is vertical to the second surface S2 on a section of the second semiconductor component 20 taken along a plane vertical to the second surface S2, the second semiconductor component 20 includes a third portion 223 with a third length, and a fourth portion 224 with a fourth length longer than the third length. The third length and the fourth length correspond to the length in the Z-direction of the third portion 223 and the length in the Z-direction of the fourth portion 224, respectively, in FIG. 9A. In other words, the position of the bottom 141 described above corresponds to the position of the lower surface of the fourth portion 224.

The concave portion 14 may preferably surround the second surface S2 in a planar view of the second surface S2. In other words, the fourth portion 224 may preferably surround the third portion 223 in a planar view of the second surface S2. If the concave portion 14 is formed to surround the second surface S2 in a planar view, the above-described relations (3) and (4) can be satisfied. This leads to a further increase in the reliability of bonding as described above.

Assume that the depth of the concave portion 14, or the difference between the third length and the fourth length is represented by "f". In other words, the depth "f" of the concave portion 14 corresponds to the depth of the bottom 141 of the concave portion 14 based on a plane including the second surface S2, or corresponds to the distance from the plane including the second surface S2 to the bottom 141 of the concave portion 14.

Also, assume that the depth of the bottom of each conductor portion 2211 included in the second semiconductor component 20 is represented by "g". In other words, the depth "g" of the bottom of each conductor portion 2211 corresponds to the depth of the bottom of each conductor portion 2211 based on the plane including the second surface S2, or corresponds to the distance from the plane including the second surface S2 to the bottom of each conductor portion 2211.

In this case, the depth "f" of the concave portion 14 may preferably be greater than the depth "g" of the bottom of each conductor portion 2211 (f>g). In other words, the bottom 141 of the concave portion 14 may preferably be located at a position further from the plane including the second surface S2 than the bottom of each conductor portion 2211. The depth "f" of the concave portion 14 may preferably be greater than the thickness of the wiring layer forming the second surface S2 in the at least one wiring layer forming the second wiring structure 220. As described below, in the process of bonding the first semiconductor component 10 and the second semiconductor component 20, the first surface S1 of the first semiconductor component 10 and the second surface S2 of the second semiconductor component 20 are bonded together and then a heat treatment is performed, thereby increasing the bonding strength. In the heat treatment, heat deformation can occur due to, for example, a difference in the coefficient of thermal expansion of materials forming the conductor portions 1211 and 2211 and the insulator portions 1212 and 2212. According to the present exemplary embodiment, the depth "f" of the concave portion 14 is set to be greater than the depth "g" of the bottom of each conductor portion 2211 and the thickness of the wiring layer forming the second surface S2, thereby making it possible to perform bonding while reducing effects due to heat deformation. This leads to an increase in the reliability of bonding.

As illustrated in FIG. 9A, the distance from the sealing ring 222 to a side wall of the concave portion 14 is represented by "h". In this case, the distance "h" may be preferably more than or equal to 1 μm. Assuming that a region obtained by projecting the sealing ring 222 on the virtual plane VP in the normal direction of the virtual plane VP is a ninth region S9, the shortest distance "h" between the circumference of the ninth region S9 and the circumference of the second region A2 may be preferably more than or equal to 1 μm. When the distance "h" is more than or equal to 1 μm, damage to the second semiconductor component 20 during formation of the concave portion 14 can be reduced. When the distance "h" is more than or equal to 1 μm, penetration of water can be prevented even in a case where the concave portion 14 is formed.

It may be preferable that the contour of the eighth region A8 have no internal angle of less than or equal to 90°. In the present exemplary embodiment, the contour of the eighth region A8 has no corner and the long sides and short sides of the contour are smoothly connected with a curve having an arc shape as illustrated in FIG. 9B. As described below, the process of bonding the first semiconductor component 10 and the second semiconductor component 20 is completed by bonding the entire first surface S1 to the second surface S2. In this case, if the contour of the eighth region A8 has an internal angle of less than or equal to 90°, progress in bonding between the first surface S1 and the second surface S2 may be inhibited at the angle and the bonding may progress unevenly. This may cause deterioration in the reliability of bonding. In contrast, according to the present exemplary embodiment, the contour of the eighth region A8 is set to have no internal angle of less than or equal to 90°, thereby preventing the bonding from progressing unevenly, which leads to an increase in the reliability of bonding.

While the present exemplary embodiment illustrates an example where the long sides and short sides of the contour of the eighth region A8 are smoothly connected with a curve having an arc shape, the present exemplary embodiment is not limited to this example. The long sides and short sides may be smoothly connected with a curve having a shape other than an arc shape. The curvature of each curve is not particularly limited, as long as the eighth region A8 includes a curved portion. The contour of the eighth region A8 may have an internal angle of more than 90°.

<<Manufacturing Method>>

Next, a manufacturing method of the semiconductor device 1 will be described. In the present exemplary embodiment, repeated descriptions of processes in the manufacturing method that are similar to those in the above-described exemplary embodiment are omitted. A manufacturing method of the wafer for the second semiconductor component 20 will be described.

<Manufacturing Method of Wafer for Second Semiconductor Component 20>

A manufacturing method of the wafer for the second semiconductor component 20 will now be described with reference to FIGS. 10A to 10G. FIGS. 10A to 10G are schematic diagrams each illustrating a process in the manufacturing method of the wafer for the second semiconductor component 20. FIGS. 10A to 10G each illustrate a part of the wafer.

(Step S401)

FIGS. 10A to 10D are similar to steps S201 to S205, respectively, and thus repeated descriptions thereof are omitted.

(Step S402)

The concave portion 14 is formed by photolithography and etching as illustrated in FIG. 10E. The region surrounded by the concave portion 14 on the upper surface of the wafer for the second semiconductor component 20 corresponds to the second surface S2. Accordingly, the contour of the second surface S2 is formed by the etching process.

(Step S403)

Next, the wafer is diced to form the second semiconductor component 20 as illustrated in FIG. 10F. As a dicing method, a dicing process such as blade dicing using a blade, or laser dicing using a laser is used. Two or more types of these methods may be used in combination.

Through the above-described processes, the second semiconductor component 20 before bonding as illustrated in FIG. 10G is completed.

The contour of the fourth surface S4 of the second semiconductor component 20 is formed by dicing in step S402. If chipping occurs in the dicing process, the flatness of the fourth surface S4 decreases in the vicinity of the contour of the fourth surface S4, which may result in generation of a step. Accordingly, the second semiconductor component 20 may include a step in the normal direction of the fourth surface S4 in the vicinity of the contour of the fourth surface S4.

Through the above-described processes, the second semiconductor component 20 before bonding is completed.

Figures 11A, 11B:
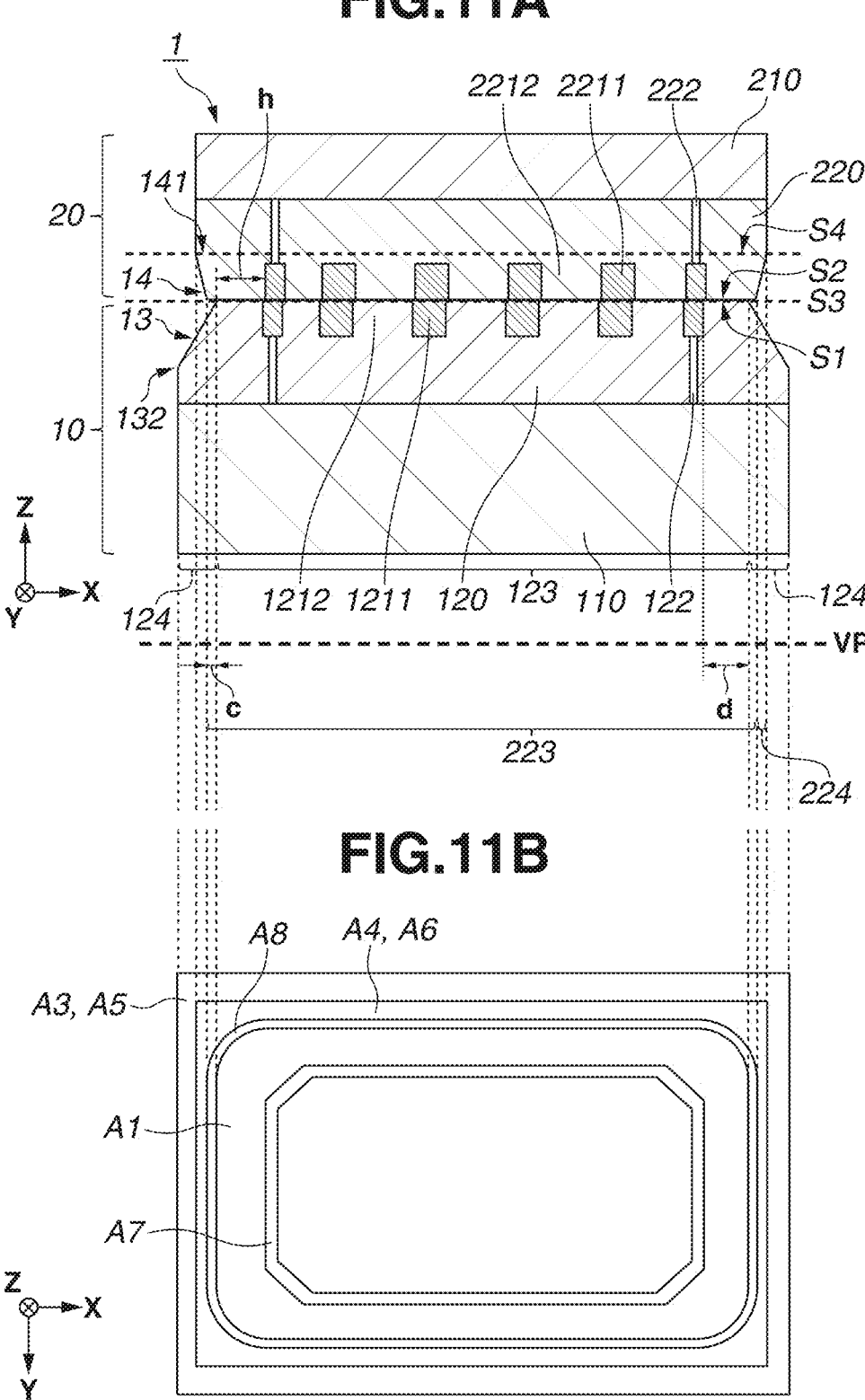
FIG. 11A is a sectional view illustrating an example of a semiconductor device according to a third exemplary embodiment.
FIG. 11B illustrates a projection of the semiconductor device according to the third exemplary embodiment.

FIGS. 11A and 11B each illustrate the semiconductor device 1 according to a third exemplary embodiment. FIG. 11A is a sectional view of the semiconductor device 1, and FIG. 11B illustrates a projection of the semiconductor device 1 obtained by vertically projecting each portion of the semiconductor device 1 on the virtual plane VP. In the present exemplary embodiment, components similar to those in the sectional structure of the semiconductor device 1 illustrated in FIGS. 1A and 1B and FIGS. 9A and 9B are denoted by the same reference numerals, and repeated descriptions are omitted.

As illustrated in FIG. 11A, in the present exemplary embodiment, the first semiconductor component 10 includes the concave portion 13 that is recessed toward the first semiconductor substrate 110 from the first surface S1. A side surface of the concave portion 13 that faces the first wiring structure 120 may preferably have no internal angle of less than or equal to 90°. In the present exemplary embodiment, as illustrated in FIG. 11A, the side surface of the concave portion 13 has an internal angle of more than or equal to 90° and the side surfaces of the concave portion 13 are in contact with the contour of the third region A3.

The semiconductor device 1 is diced by a dicing process, such as blade dicing using a blade, or laser dicing using a laser. In this case, a side surface 132 of the concave portion 13 that faces the first wiring structure 120 is formed to have no internal angle of less than or equal to 90°, thereby preventing damage to the first wiring structure 120 due to stress concentration on a corner portion during the dicing process, which leads to an increase in the reliability of bonding.

More specifically, as illustrated in FIG. 11A, in the present exemplary embodiment, the side surface 132 formed in a range from the first surface S1 to the third region A3 in a sectional view has a tapered shape. If dicing is performed in the state illustrated in FIG. 7B, stress is concentrated on corner portions included in the circumference of the first wiring structure 210 and on corner portions included in the circumference of the second wiring structure 220 during the dicing process. In contrast, the side surface 132 has a tapered shape, which makes it possible to reduce the stress concentration, according to the present exemplary embodiment.

The second semiconductor component 20 also includes the concave portion 14 that is recessed toward the second semiconductor substrate 210 from the second surface S2. A side surface 142 of the concave portion 14 that faces the second wiring structure 220 may preferably have no internal angle of less than or equal to 90°. In the present exemplary embodiment, the side surface 142 of the concave portion 14 has an internal angle of more than or equal to 90° as illustrated in FIG. 11A, and the side surface 142 of the concave portion 14 is in contact with the contour of the fourth region A4.

More specifically, in the present exemplary embodiment, the side surface 142 formed in a range from the second surface S2 to the fourth region A4 in a sectional view has a tapered shape as illustrated in FIG. 11A. If dicing is performed in the state illustrated in FIG. 11B, stress is concentrated on corner portions included in the circumference of the first wiring structure 210 and on corner portions included in the circumference of the second wiring structure 220 during the dicing process. In contrast, according to the present exemplary embodiment, the side surface 142 has a tapered shape, which makes it possible to reduce the stress concentration.

The second semiconductor component 20 is diced by a dicing process, such as blade dicing using a blade, or laser dicing using a laser. In this case, the side surface 142 of the concave portion 14 that faces the second wiring structure 220 is formed to have no internal angle of less than or equal to 90°. This configuration can prevent damage to the second wiring structure 220 due to stress concentration on the corner portions during the dicing process, and lead to an increase in the reliability of bonding.

While the present exemplary embodiment described above illustrates an example where the side surfaces of the concave portion 13 of the first semiconductor component 10 and the concave portion 14 of the second semiconductor component 20 have no internal angle of less than or equal to 90° (the example having a tapered shape), the present exemplary embodiment is not limited to this example. Only the concave portion 13 of the first semiconductor component 10 may include a side surface having no internal angle of less than or equal to 90°. Alternatively, only the concave portion 14 of the second semiconductor component 20 may include a side surface having no internal angle of less than or equal to 90° (having a tapered shape).

<<Manufacturing Method>>

Next, a manufacturing method of the semiconductor device 1 will be described. Repeated descriptions of processes in the manufacturing method according to the present exemplary embodiment that are similar to those in the manufacturing methods according to the first to fourth exemplary embodiments are omitted. A manufacturing method of the wafer for the first semiconductor component 10 before bonding will be described below.

<Manufacturing Method of Wafer for First Semiconductor Component 10>

A manufacturing method of the wafer for the first semiconductor component 10 will now be described with reference to FIGS. 12A to 12F. FIGS. 12A to 12F are schematic diagrams each illustrating a process in the manufacturing method of the wafer for the first semiconductor component 10. FIGS. 12A to 12F each illustrate a part of the wafer.

(Step S501)

FIGS. 12A to 12D are similar to steps S101 to S105, respectively, and thus repeated descriptions thereof are omitted.

(Step S502)

Figures 12A, 12B, 12C, 12D, 12E, 12F:
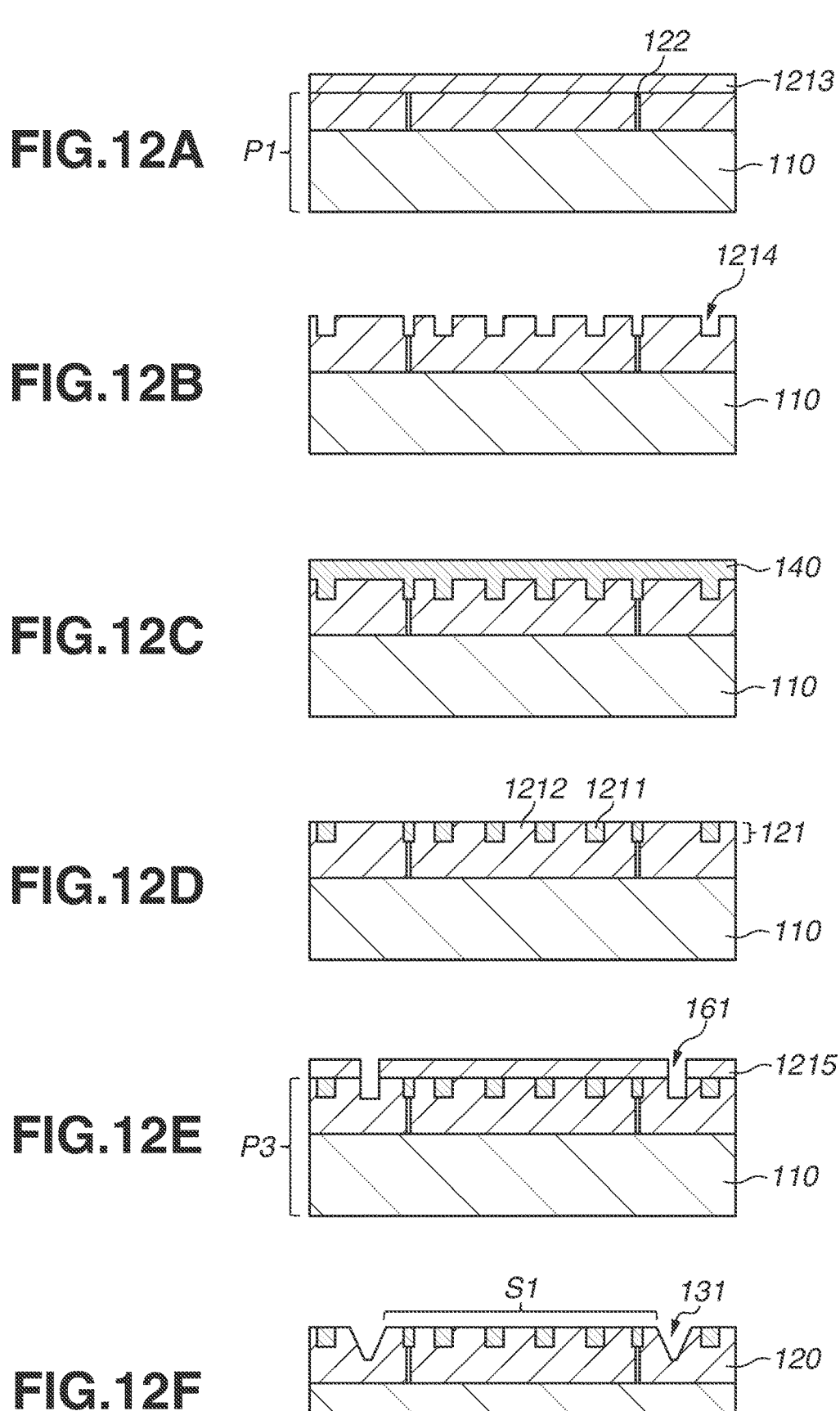
FIGS. 12A to 12F each illustrate a manufacturing process of the semiconductor device according to the third exemplary embodiment.

As illustrated in FIG. 12E, an insulation film 1215 is formed on a wafer P3. Examples of the insulation film 1215 include a silicon oxide film, a silicon nitride film, a silicon oxynitride film, a carbon-containing silicon oxide film, and a fluoride-containing silicon oxide film. The insulation film 1215 may be formed of a single layer made of one type of material, or may be formed of a plurality of layers made of different types of materials.

Next, a concave portion 161 is formed by photolithography and etching.

(Step S503)

As illustrated in FIG. 12F, an extra amount of the insulation film 1215 on the conductor portions 1211 is then removed by CMP to form the conductor portions 1211. Planarization is performed by CMP, thereby actively polishing the corner portions of the concave portion 161. Thus, the side surface 132 is formed into a tapered shape. The formation of the conductor portions 1211 with an appropriate density over the entire chip area makes it possible to prevent dishing or erosion from occurring due to the CMP process during the CMP process. This leads to an improvement in the flatness of the surface of the semiconductor wafer for the first semiconductor component 10 before bonding, and also leads to a reduction in defects caused due to a step during bonding. Through this process, the first wiring structure 120 is completed.

<Manufacturing Method of Semiconductor Device 1>

Figure 13A:
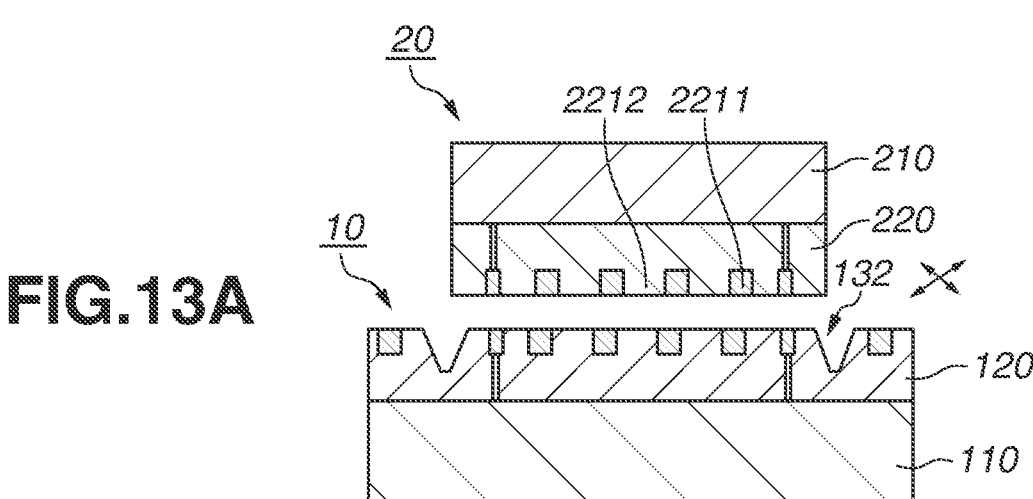
FIGS. 13A to 13C each illustrate a manufacturing process of the semiconductor device according to the third exemplary embodiment.
Figure 13B:
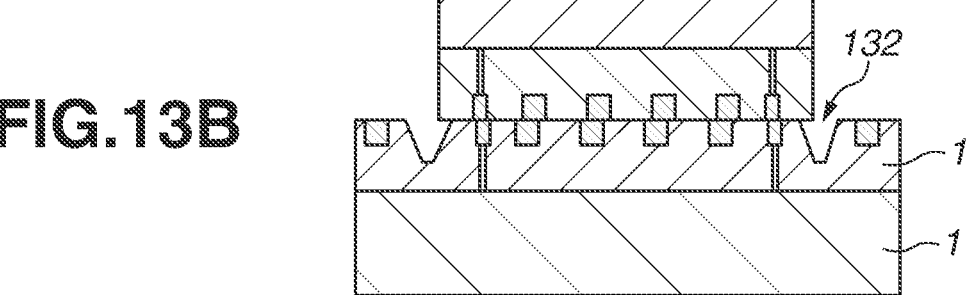
Figure 13C:
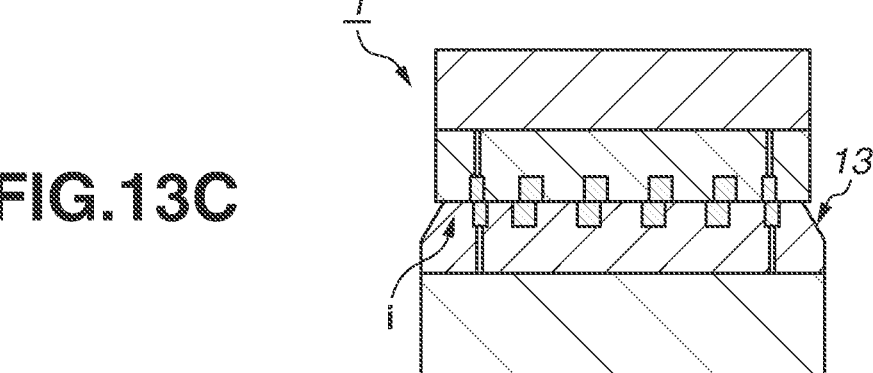

Lastly, a manufacturing method of the semiconductor device 1 in a case where only the concave portion 13 of the first semiconductor component 10 includes a side surface 132 having no internal angle of less than or equal to 90° will be described with reference to FIGS. 13A to 13C. FIGS. 13A to 13C are schematic diagrams each illustrating a process in the manufacturing method of the semiconductor device 1. FIGS. 13A to 13C each illustrate a part of the wafer. The manufacturing method of the second semiconductor component 20 is similar to that of the first exemplary embodiment, and thus repeated descriptions thereof are omitted.

(Step S601)

As illustrated in FIG. 13A, the second semiconductor component 20 is reversed to face the wafer for the first semiconductor component 10. More specifically, the second semiconductor component 20 and the first semiconductor component 10 are opposed to each other so that the second surface S2 of the second semiconductor component 20 and the first surface S1 of the wafer for the first semiconductor component 10 face each other. The alignment process is then performed such that the conductor portions 1211 of the first semiconductor component 10 and the conductor portions 2211 of the second semiconductor component 20 overlap each other in a planar view and the insulator portion 1212 of the first semiconductor component 10 and the insulator portion 2212 of the second semiconductor component 20 overlap each other in a planar view. The alignment process may be performed by rotating the first semiconductor component 10 in the XY direction within the XY plane, or by rotating the second semiconductor component 20 in the XY direction within the XY plane, or may be performed using these methods in combination.

(Step S602)

Next, the second semiconductor component 20 and the wafer for the first semiconductor component 10 are brought into contact with each other and bonded together on the bonded surface S3 as illustrated in FIG. 13B. After bonding, the structure is thereby obtained in which the second semiconductor component 20 is stacked on the wafer for the first semiconductor component 10. Bonding may be achieved by, for example, performing the temporary bonding process and then performing the main bonding process. First, the insulator portion 1212 of the first surface S1 and the insulator portion 2212 of the second surface S2 are activated by plasma activation. The activated insulator portions 1212 and 2212 are then bonded together, thereby performing a temporary bonding process for bonding the second semiconductor component 20 and the wafer for the first semiconductor component 10. Thereafter, for example, a heat treatment is performed at 350° C. to thereby bond the insulator portion 1212 and the insulator portion 2212 on the bonded surface S3 more tightly than in the temporary bonding process (main bonding process). The conductor portions 1211 and the conductor portions 2211 are bonded together by interdiffusion of copper between the conductor portions 1211 and the conductor portions 2211.

After bonding, a process for processing the second semiconductor component 20 stacked on the wafer for the first semiconductor component 10 may be provided. For example, a process for reducing the thickness of the second semiconductor substrate 210 of the second semiconductor component 20 may be provided. As a method for reducing the thickness of the second semiconductor substrate 210, backgrinding, CMP, etching, or the like can be used. Alternatively, a film formation process for forming a film may be provided, such as a metal oxide film, an antireflection film, and an insulation film.

(Step S603)

Next, as illustrated in FIG. 13C, the wafer for the first semiconductor component 10 is diced to obtain the semiconductor device 1. The side surface 132 of the concave portion 13 has a tapered shape and is formed to have no internal angle "i" of less than or equal to 90°. This prevents stress from being locally concentrated on the corner portions of the concave portion 13 during dicing of the semiconductor device 1, thereby preventing damage to the first wiring structure 120. The semiconductor device 1 is thus completed. The present exemplary embodiment described above illustrates a configuration example where the first semiconductor component 10 in the shape of a wafer is bonded to the second semiconductor component 20 that is diced to be in the shape of a chip (also called a die). This bonding method is also called die-to-wafer bonding. However, the present exemplary embodiment is not limited to this example. The first semiconductor component 10 that is also diced to be in the shape of a chip may be bonded to the second semiconductor component 20 that is in the shape of a chip.

Figures 14A, 14B:
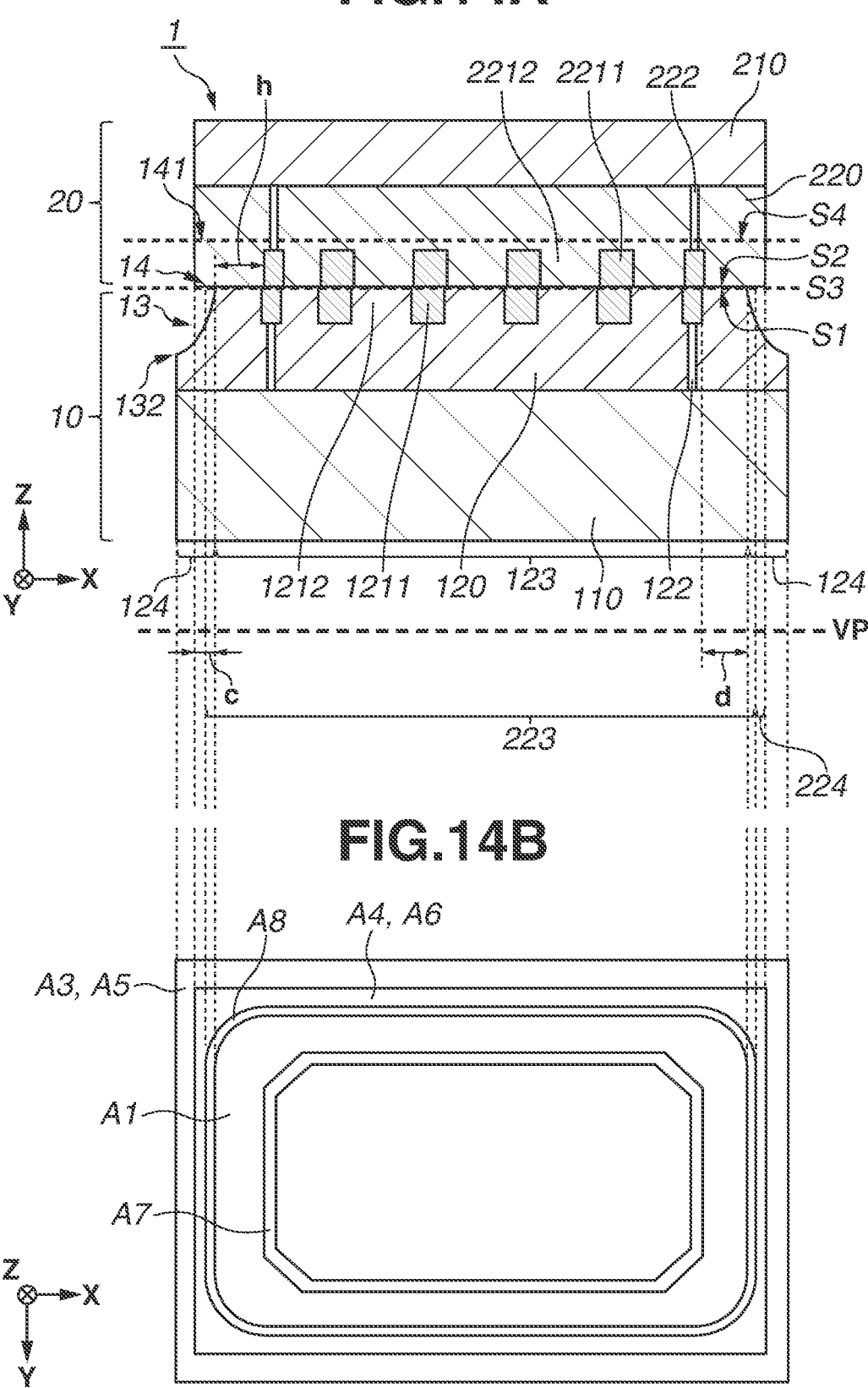
FIG. 14A is a sectional view illustrating an example of a semiconductor device according to a fourth exemplary embodiment.
FIG. 14B illustrates a projection of the semiconductor device according to the fourth exemplary embodiment.

FIGS. 14A and 14B each illustrate the semiconductor device 1 according to a fourth exemplary embodiment. FIG. 14A is a sectional view of the semiconductor device 1, and FIG. 14B illustrates a projection of the semiconductor device 1 obtained by vertically projecting each portion of the semiconductor device 1 on the virtual plane VP. In the present exemplary embodiment, components similar to those in a sectional structure of the semiconductor device 1 illustrated in FIGS. 1A and 1B, FIGS. 9A and 9B, and FIGS. 11A and 11B are denoted by the same reference numerals, and repeated descriptions are omitted.

In the present exemplary embodiment, the first semiconductor component 10 includes the concave portion 13 recessed toward the first semiconductor substrate 110 from the first surface S1 as illustrated in FIG. 14A. The side surface 132 of the concave portion 13 that faces the first wiring structure 120 is preferably smoothly connected with a curve having an arc shape and may preferably have no internal angle of less than or equal to 90°. This configuration prevents stress from being locally concentrated on the corner portions of the concave portion 13 during dicing of the semiconductor device 1, thereby preventing damage to the first wiring structure 120. While the present exemplary embodiment illustrates an example where the side surface 132 of the concave portion 13 that faces the first wiring structure 120 is smoothly connected with a curve having an arc shape, the present exemplary embodiment is not limited to this example. The side surface 132 of the concave portion 13 may be smoothly connected with a curve having a shape other than an arc shape. The curvature of the curve is not particularly limited. Although not illustrated, the side surface 142 illustrated in FIG. 11A may be formed with an arc shape instead of a tapered shape.

Figure 15:
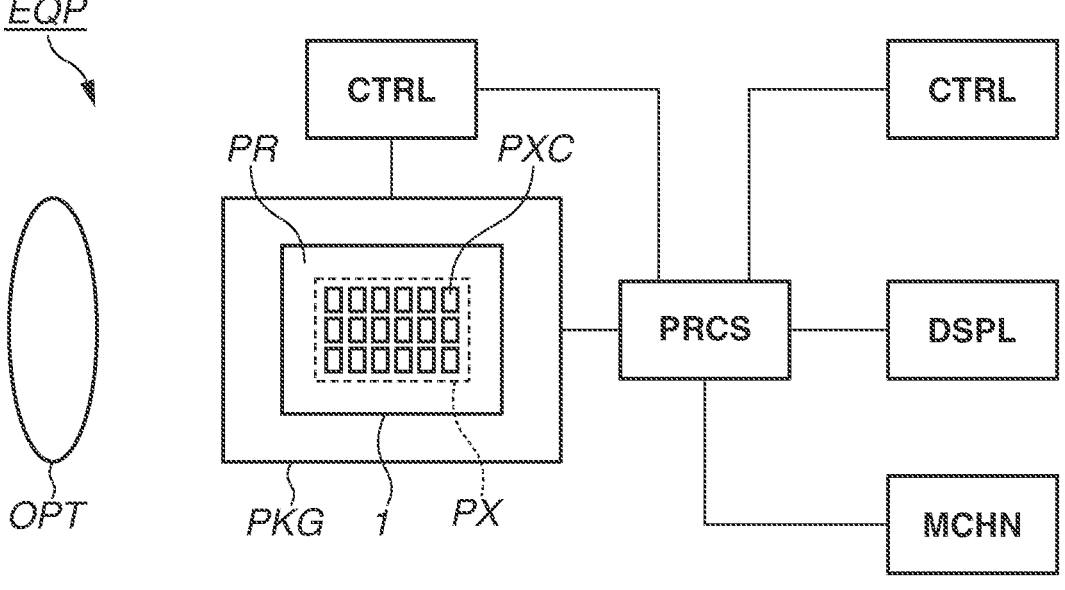
FIG. 15 is a block diagram illustrating a schematic configuration of equipment according to a fifth exemplary embodiment.

Equipment EQP including the semiconductor device 1 in the above-described exemplary embodiments will be described in detail below with reference to FIG. 15. FIG. 15 is a block diagram illustrating a schematic configuration of the equipment EQP.

The equipment EQP includes a package PKG for packaging the semiconductor device 1. In the present exemplary embodiment, a photoelectric conversion apparatus (solid image capturing apparatus) is used as the semiconductor device 1. The semiconductor device 1 includes a pixel region PX in which pixel circuits PXC are arranged in a matrix, and a peripheral region PR that is located near the pixel region PX. Peripheral circuits can be provided in the peripheral region PR. The pixel region PX may be provided in one of the first semiconductor component 10 and the second semiconductor component 20, and the peripheral region PR may be provided in the other of the first semiconductor component 10 and the second semiconductor component 20.

The package PKG can include a base to which the semiconductor device 1 is fixed, a lid that is opposed to the semiconductor device 1 and is made of glass or the like, and connection members, such as a bonding wire and a bump, to connect terminals provided on the base to terminals provided on the semiconductor device 1.

The equipment EQP may include at least one of an optical system OPT, a control device CTRL, a processing device PRCS, a display device DSPL, a storage device MMRY, and a mechanical device MCHN.

The optical system OPT is configured to form an image on the semiconductor device 1. The optical system OPT includes, for example, a lens, a shutter, and a mirror.

The control device CTRL is configured to control the semiconductor device 1. The control device CTRL is, for example, an arithmetic device, such as an application specific integrated circuit (ASIC). The processing device PRCS is configured to process a signal output from the semiconductor device 1. The processing device PRCS is an arithmetic device, such as a central processing unit (CPU) or an ASIC, to configure an analog front-end (AFE) or a digital front-end (DFB).

The display device DSPL is an organic electroluminescence (EL) display device or a liquid crystal display device that displays information (images) obtained by the semiconductor device 1. The storage device MMRY is a magnetic device or a semiconductor device that stores information (images) obtained by the semiconductor device 1. The storage device MMRY is a volatile memory, such as a static random access memory (SRAM), a dynamic RAM, or a nonvolatile memory, such as a flash memory or a hard disk drive.

The mechanical device MCHN includes a movable portion such as a motor or an engine, or a propulsion portion. The equipment EQP displays signals output from the semiconductor device 1 on the display device DSPL and transmits the signals to the outside using a communication apparatus (not illustrated) included in the equipment EQP. Thus, the equipment EQP may preferably include the storage device MMRY and the processing device PRCS separately from a storage circuit and an arithmetic circuit included in the semiconductor device 1. The mechanical device MCHN may be controlled based on signals output from the semiconductor device 1.

The equipment EQP is suitably used as electronic equipment, such as an information terminal (e.g., a smartphone and a wearable terminal) having an image capturing function, and a camera (e.g., a lens-interchangeable camera, a compact camera, a video camera, and a monitoring camera). The mechanical device MCHN in a camera is configured to drive components of the optical system OPT to perform a zooming operation, a focusing operation, and a shutter operation.

The equipment EQP can be transport equipment such as a vehicle, a ship, or a flight vehicle. The mechanical device MCHN in transport equipment can be used as a movable device. The equipment EQP serving as transport equipment is suitably used for equipment for transporting the semiconductor device 1, and equipment for assisting and/or automation of driving (operation) using the image capturing function. The processing device PRCS for assisting and/or automation of driving (operation) is configured to perform processing for operating the mechanical device MCHN as a movable device based on information obtained by the semiconductor device 1. Alternatively, the equipment EQP may be medical equipment such as an endoscope, measurement equipment such as a ranging sensor, or analysis equipment such as an electron microscope.

The above-described exemplary embodiments can be modified in various ways without departing from the technical idea of the invention. The invention is not limited to the disclosed exemplary embodiments, and the scope of the following claims is to be accorded the broadest interpretation so as to encompass all such modifications that can be understood from the specification and the accompanying drawings.

According to the present exemplary embodiment, the reliability of a bonded portion of a semiconductor device can be improved. Thus, the use of the semiconductor device according to the present exemplary embodiment enhances the performance of the semiconductor device. For example, when the semiconductor device is mounted on transport equipment, an excellent image quality and high measurement accuracy can be obtained during image capturing on the outside of the transport equipment or during measurement of an external environment, accordingly. In terms of enhancement of the performance of transport equipment, it is therefore advantageous to determine to mount the semiconductor device according to the present exemplary embodiment on transport equipment to manufacture and sell the transport equipment.

Figure 16:
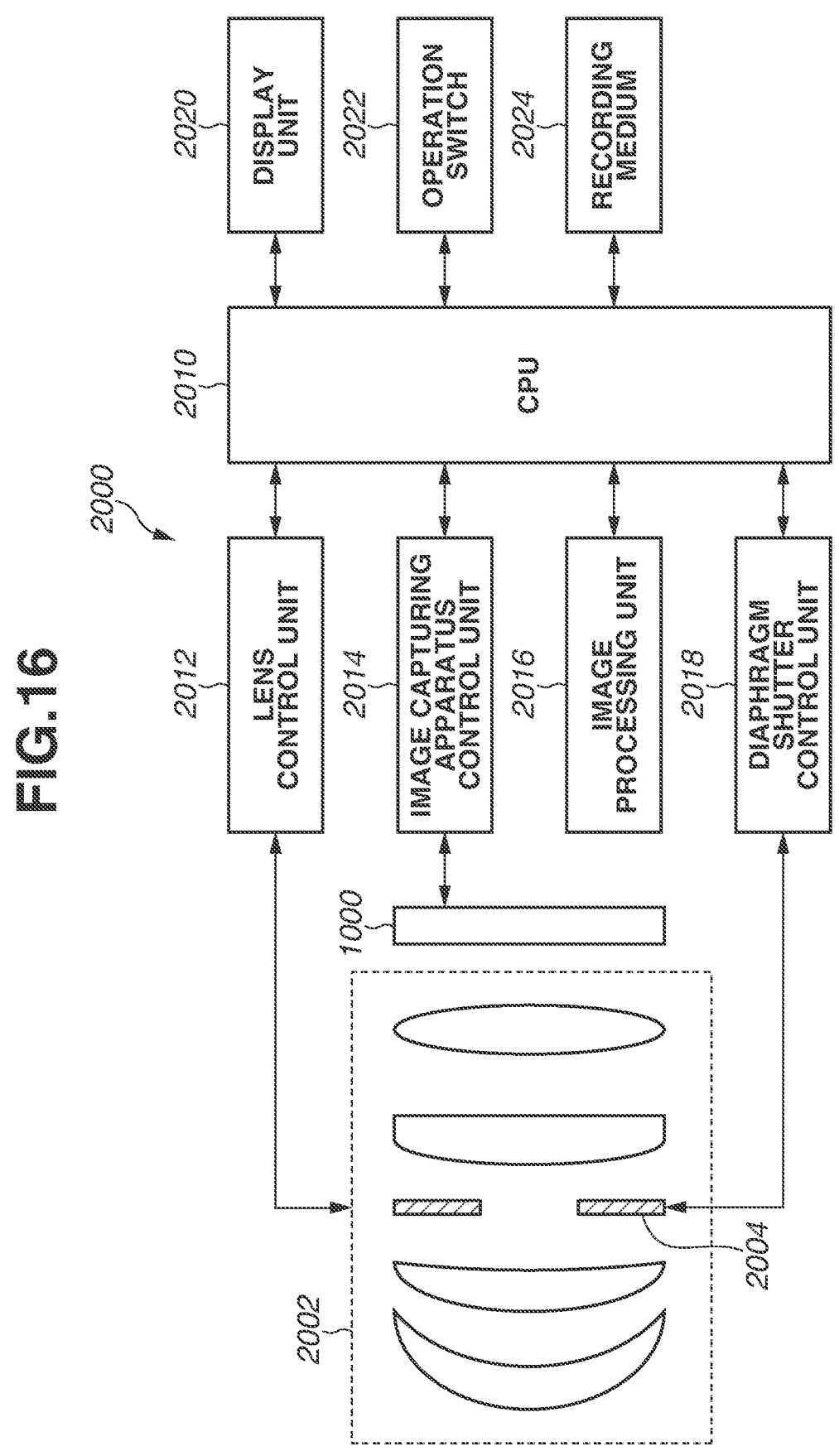
FIG. 16 is a block diagram illustrating a schematic configuration of an image capturing system according to a sixth exemplary embodiment.

An image capturing system according to a sixth exemplary embodiment of the present invention will now be described with reference to FIG. 16. FIG. 16 is a block diagram illustrating a schematic configuration of the image capturing system according to the sixth exemplary embodiment.

The semiconductor device 1 (image capturing apparatus) described in the above-described exemplary embodiments can be applied to various image capturing systems. The applicable image capturing systems are not particularly limited. Examples of the applicable image capturing systems include various types of equipment, such as a digital still camera, a digital camcorder, a monitoring camera, a copying machine, a facsimile machine, a cellular phone, an on-vehicle camera, an observation satellite, and a medical camera. Examples of the applicable image capturing systems also include a camera module including an optical system (i.e., a lens), and an image capturing apparatus (photoelectric conversion apparatus). FIG. 16 illustrates a block diagram of a digital still camera as an example of the applicable image capturing systems.

As illustrated in FIG. 16, an image capturing system 2000 includes an image capturing apparatus 1000, an image capturing optical system 2002, a CPU 2010, a lens control unit 2012, an image capturing apparatus control unit 2014, and an image processing unit 2016. The image capturing system 2000 also includes a diaphragm shutter control unit 2018, a display unit 2020, an operation switch 2022, and a recording medium 2024.

The image capturing optical system 2002 is an optical system for forming an optical image of an object, and includes a lens group and a diaphragm 2004. The diaphragm 2004 has a light amount adjustment function to be used during image capturing by adjusting the aperture diameter of the diaphragm 2004 and a function of an exposure time adjustment shutter during still image capturing. The lens group and the diaphragm 2004 are held to be movable forward and backward along an optical axis, and a linked operation of these elements implements a scaling function (zooming function) and a focus adjustment function. The image capturing optical system 2002 may be integrated with the image capturing system 2000, or may be an image capturing lens that is mountable on the image capturing system 2000.

The image capturing apparatus 1000 is located such that an image capturing surface is located in the image space of the image capturing optical system 2002. The image capturing apparatus 1000 corresponds to the semiconductor device 1 described in the first exemplary embodiment, and includes a complementary metal-oxide semiconductor (CMOS) sensor (pixel portion) and peripheral circuits (peripheral circuit region). The image capturing apparatus 1000 includes pixels having a plurality of photoelectric conversion portions arranged two-dimensionally and color filters arranged on the pixels, thereby forming a two-dimensional single-plate color sensor. The image capturing apparatus 1000 photoelectrically converts an object image formed by the image capturing optical system 2002, and outputs an image signal and a focus detection signal.

The lens control unit 2012 is configured to control forward/backward driving of the lens group of the image capturing optical system 2002 to perform the scaling function and the focus adjustment function, and includes circuits and processing devices configured to implement these functions. The diaphragm shutter control unit 2018 is configured to change the aperture diameter of the diaphragm 2004 and adjust the amount of image capturing light (with an aperture value as variable), and includes circuits and processing devices configured to implement these functions.

The CPU 2010 is a control device in a camera for performing various control operations on a camera body, and the CPU 2010 includes an arithmetic unit, a read-only memory (ROM), a RAM, an analog-to-digital (A/D) converter, a digital-to-analog (D/A) converter, and a communication interface circuit. The CPU 2010 controls the operation of each unit in the camera according to computer programs stored in the ROM or the like, and executes a series of image capturing operations, such as an autofocus (AF) operation including detection (focus detection) of a focus state of the image capturing optical system 2002, image processing, and recording. The CPU 2010 also functions as a signal processing unit.

The image capturing apparatus control unit 2014 controls the operation of the image capturing apparatus 1000, performs A/D conversion on a signal output from the image capturing apparatus 1000, and transmits the signal to the CPU 2010. The image capturing apparatus control unit 2014 includes circuits and control devices configured to implement these functions. The A/D conversion function may be included in the image capturing apparatus 1000. The image processing unit 2016 is a processing device that performs image processing, such as γ-conversion or color interpolation, on the signal obtained after the A/D conversion, thereby generating an image signal. The image processing unit 2016 includes circuits and control devices configured to implement these functions. The display unit 2020 is a display device such as a liquid crystal display device (LCD), and displays, for example, information about camera image capturing modes, a preview image before image capturing, an image for checking after image capturing, and an in-focus state during focus detection. The operation switch 2022 includes a power supply switch, a release (image capturing trigger) switch, a zoom operation switch, and an image capturing mode selection switch. The recording medium 2024 is used for recording captured images and the like. The recording medium 2024 may be incorporated in the image capturing system, or may be a detachable medium such as a memory card.

As described above, the image capturing system 2000 to which the semiconductor device 1 according to the first exemplary embodiment is applied is configured to thereby implement the image capturing system with a high performance.

Figure 17A:
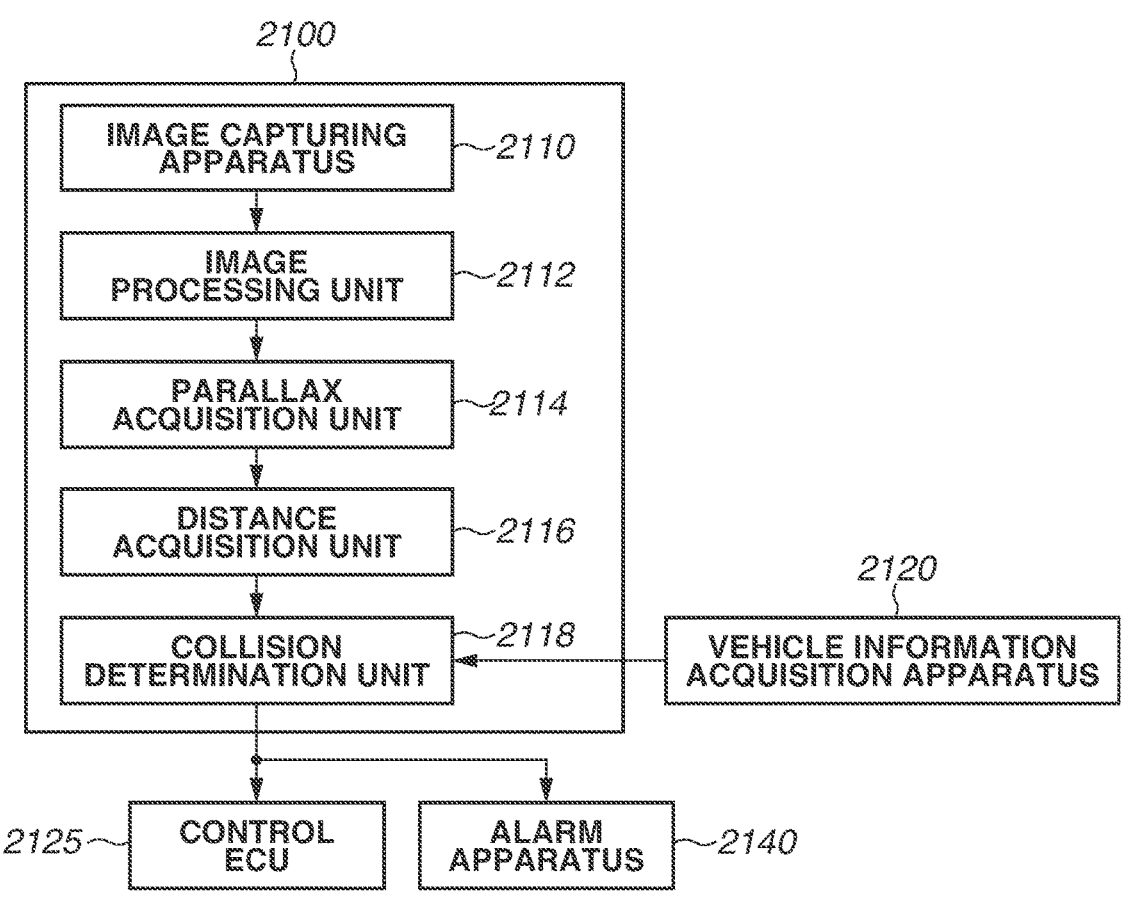
FIGS. 17A and 17B each illustrate a schematic configuration of an image capturing system and a moving body according to a seventh exemplary embodiment.
Figure 17B:
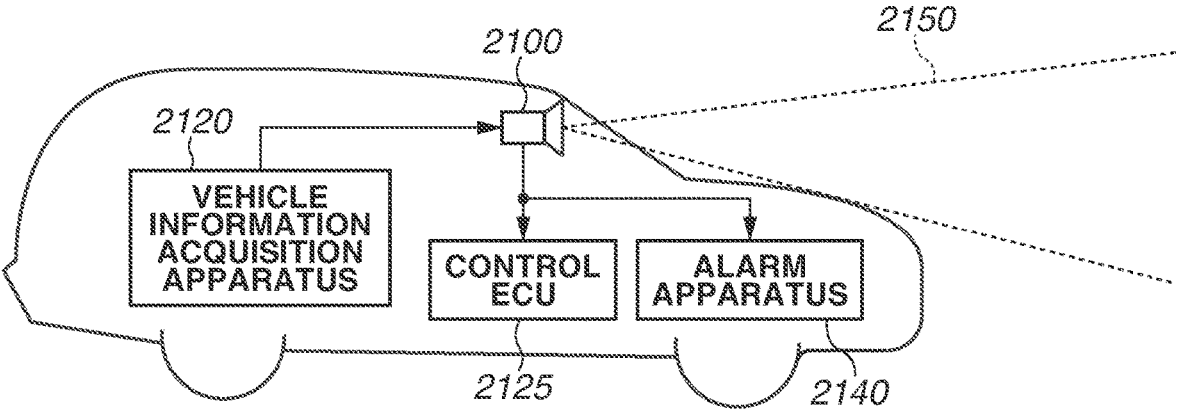

An image capturing system and a moving body according to a seventh exemplary embodiment of the present invention will be described with reference to FIGS. 17A and 17B. FIGS. 17A and 17B each illustrate a schematic configuration of each of the image capturing system and the moving body according to the seventh exemplary embodiment.

FIG. 17A illustrates an example of an image capturing system 2100 for an on-vehicle camera. The image capturing system 2100 includes an image capturing apparatus 2110. The image capturing apparatus 2110 corresponds to the semiconductor device 1 according to the first exemplary embodiment described above. The image capturing system 2100 includes an image processing unit 2112 as a processing device that performs image processing on a plurality of pieces of image data acquired by the image capturing apparatus 2110. The image capturing system 2100 also includes a parallax acquisition unit 2114 as a processing device that calculates a parallax (a phase difference between parallax images) based on a plurality of pieces of image data acquired by the image capturing apparatus 2110. The image capturing system 2100 also includes a distance acquisition unit 2116 as a processing device that calculates a distance to an object based on the calculated parallax. The image capturing system 2100 also includes a collision determination unit 2118 as a processing device that determines the possibility of occurrence of a collision based on the calculated distance. In this case, the parallax acquisition unit 2114 and the distance acquisition unit 2116 are examples of an information acquisition unit that acquires information, such as distance information indicating a distance to an object. In other words, the distance information is information about, for example, a parallax, a defocus amount, and a distance to an object. The collision determination unit 2118 may determine the possibility of occurrence of a collision using any one of the distance information. The above-described processing devices may be implemented by exclusively-designed hardware, or may be implemented by general-purpose hardware used for calculations based on software modules. Alternatively, the processing devices may be implemented by a field programmable gate array (FPGA), an ASIC, or the like, or a combination thereof.

The image capturing system 2100 is connected to a vehicle information acquisition apparatus 2120, and can obtain vehicle information, such as a vehicle speed, a yaw rate, and a steering angle. The image capturing system 2100 is also connected to a control ECU 2125 serving as a control device that outputs a control signal for causing a breaking force on a vehicle based on the determination result from the collision determination unit 2118. In other words, the control ECU 2125 is an example of a moving body control unit that controls a moving body based on the distance information. The image capturing system 2100 is also connected to an alarm apparatus 2140 that issues an alarm to a driver based on the determination result from the collision determination unit 2118. For example, if it is highly likely that a collision may occur based on the determination result from the collision determination unit 2118, the control ECU 2125 performs a vehicle control for avoiding a collision or reducing a damage by, for example, applying a brake, releasing an accelerator, or suppressing an engine output. The alarm apparatus 2140 issues an alarm to a user by, for example, issuing an alarm such as sound, displaying alarm information on a screen of a car navigation system or the like, or applying a vibration to a seat belt or a steering wheel.

In the present exemplary embodiment, the image capturing system 2100 captures an image of the periphery of the vehicle, for example, the front or the back of the vehicle. FIG. 17B illustrates a configuration example of the image capturing system 2100 when an image of a front portion (image capturing range 2150) of the vehicle is captured. The vehicle information acquisition apparatus 2120 sends an instruction to operate and cause the image capturing system 2100 to execute image capturing. The use of the semiconductor device 1 according to the first exemplary embodiment as the image capturing apparatus 2110 enables the image capturing system 2100 according to the present exemplary embodiment to further improve the ranging accuracy.

While the above-described exemplary embodiment illustrate an example of the control operation for preventing one vehicle from colliding with another vehicle, the present exemplary embodiment can also be applied to, for example, a control operation for automatic driving by following another vehicle, and a control operation for automatic driving to prevent the vehicle from deviating from a lane. The image capturing system 2100 can be applied to a vehicle such as automobile, and a moving body (transportation equipment), such as a ship, an aircraft, or an industrial robot. Examples of the movable device in the moving body (transport equipment) include various drive sources such as an engine, a motor, a wheel, and a propeller. Additionally, the movable device can be applied not only to a moving body, but also to a wide variety of equipment that uses object recognition, such as an intelligent transportation system (ITS).

According to an aspect of the present invention, it is possible to provide a technique that is advantageous in improvement in reliability of bonding in a semiconductor device obtained by bonding two semiconductor components on a bonded surface.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2021-114358, filed Jul. 9, 2021, and No. 2022-083066, filed May 20, 2022, which are hereby incorporated by reference herein in their entirety.

What is claimed is:

1. A semiconductor device comprising:
a first semiconductor component including a first semiconductor substrate and a first wiring structure including at least one insulation layer stacked on the first semiconductor substrate, the first semiconductor component having a first surface located on a side of the first wiring structure that is opposite to the first semiconductor substrate; and
a second semiconductor component including a second semiconductor substrate and a second wiring structure including at least one insulation layer stacked on the second semiconductor substrate, the second semiconductor component having a second surface located on a side of the second wiring structure opposite to the second semiconductor substrate, the first surface of the first semiconductor component and the second surface of the second semiconductor component being directly bonded together on a bonding surface of the first semiconductor component and the second semiconductor component,
wherein the at least one insulation layer stacked on the first semiconductor substrate includes a first insulator portion on the first surface,
wherein the at least one insulation layer stacked on the second semiconductor substrate includes a second insulator portion on the second surface,
wherein the first insulator portion and the second insulator portion are directly bonded together on the bonding surface,
wherein a region having an outer circumference obtained by projecting the whole first surface on a virtual plane parallel to the first surface in a normal direction of the virtual plane is a first region, a region having an outer circumference obtained by projecting the whole second surface on the virtual plane in the normal direction of the virtual plane is a second region, a region having an outer circumference obtained by projecting the whole first wiring structure on the virtual plane in the normal direction of the virtual plane is a third region, and a region having an outer circumference obtained by projecting the whole second wiring structure on the virtual plane in the normal direction of the virtual plane is a fourth region, and
wherein an area of the first region is smaller than an area of the second region, the entire outer circumference of the first region is included in the second region, an area of the fourth region is smaller than an area of the third region, and the entire outer circumference of the fourth region is included in the third region.

2. The semiconductor device according to claim 1, wherein the area of the first region is smaller than the area of the third region.

3. The semiconductor device according to claim 1,
wherein the first wiring structure includes a first conductor portion on the first surface,
wherein the second wiring structure includes a second conductor portion on the second surface, and
wherein the first conductor portion and the second conductor portion are directly bonded together on the bonding surface.

4. The semiconductor device according to claim 3, wherein the first conductor portion and the second conductor portion include copper.

5. The semiconductor device according to claim 1,
wherein a region having an outer circumference obtained by projecting the whole first semiconductor substrate on the virtual plane in the normal direction of the virtual plane is a fifth region and a region having an outer circumference obtained by projecting the whole second semiconductor substrate on the virtual plane in the normal direction of the virtual plane is a sixth region, and
wherein an area of the sixth region is smaller than an area of the fifth region, and the entire outer circumference of the sixth region is included in the fifth region.

6. The semiconductor device according to claim 1, wherein a contour of the first surface has no angle.

7. The semiconductor device according to claim 1, wherein a contour of the first surface includes a curved portion.

8. The semiconductor device according to claim 1, wherein a shortest distance between the outer circumference of the first region and the outer circumference of the second region is greater than or equal to 5 micrometers.

9. The semiconductor device according to claim 3,
wherein the first semiconductor component includes a concave portion recessed toward the first semiconductor substrate from the first surface, and
wherein a bottom of the concave portion is located farther from a plane including the first surface than a bottom of the first conductor portion.

10. The semiconductor device according to claim 1,
wherein the first semiconductor component includes a concave portion recessed toward the first semiconductor substrate from the first surface, and
wherein the concave portion surrounds the first surface in a planar view of the first surface.

11. The semiconductor device according to claim 1, wherein the first wiring structure has a side surface with a tapered shape toward the third region from the first surface.

12. The semiconductor device according to claim 1, wherein the second wiring structure has a side surface with a tapered shape toward the fourth region from the second surface.

13. The semiconductor device according to claim 1, wherein the first wiring structure has a side surface with an arc shape toward the third region from the first surface.

14. The semiconductor device according to claim 1, wherein the second wiring structure has a side surface with an arc shape toward the fourth region from the second surface.

15. The semiconductor device according to claim 1,
wherein the first wiring structure includes a guard ring,
wherein a region having an outer circumference corresponding to a shape obtained by projecting the whole guard ring on the virtual plane in the normal direction of the virtual plane is a seventh region, and
wherein a shortest distance between the outer circumference of the seventh region and the outer circumference of the first region is greater than or equal to 1 micrometer.

16. The semiconductor device according to claim 1, wherein the first semiconductor substrate contains silicon.

17. The semiconductor device according to claim 1, wherein the second semiconductor substrate contains compound semiconductor.

18. Equipment, comprising:

a semiconductor device according to claim 1; and at least one of following six components:

an optical system configured to form an image on the semiconductor device;

a control device configured to control the semiconductor device;

a processing device configured to process a signal output from the semiconductor device;

a display device configured to display information obtained by the semiconductor device;

a storage device configured to store information obtained by the semiconductor device; and a mechanical device including one of a movable portion and a propulsion portion.

* * * * *